(12) United States Patent
Balakrishnan et al.

(10) Patent No.: US 9,947,649 B1
(45) Date of Patent: Apr. 17, 2018

(54) LARGE AREA ELECTROSTATIC DISCHAGE FOR VERTICAL TRANSISTOR STRUCTURES

(71) Applicant: International Business Machines Corporation, Armonk, NY (US)

(72) Inventors: Karthik Balakrishnan, White Plains, NY (US); Pouya Hashemi, White Plains, NY (US); Alexander Reznicek, Troy, NY (US); Jeng-Bang Yau, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/488,706

(22) Filed: Apr. 17, 2017

(51) Int. Cl.
| | |
|---|---|
| *H01L 27/02* | (2006.01) |
| *H01L 29/06* | (2006.01) |
| *H01L 29/78* | (2006.01) |
| *H01L 29/66* | (2006.01) |
| *H01L 27/06* | (2006.01) |

(52) U.S. Cl.
CPC ...... *H01L 27/0255* (2013.01); *H01L 27/0629* (2013.01); *H01L 29/0649* (2013.01); *H01L 29/66545* (2013.01); *H01L 29/66553* (2013.01); *H01L 29/66666* (2013.01); *H01L 29/7827* (2013.01)

(58) Field of Classification Search
CPC .......... H01L 27/0255; H01L 29/66545; H01L 29/66553; H01L 27/0629; H01L 29/7827; H01L 29/0649; H01L 29/66666
See application file for complete search history.

(56) References Cited

U.S. PATENT DOCUMENTS 9,716,086 B1 * 7/2017 Cheng ................. H01L 27/0255

* cited by examiner

*Primary Examiner* — Roy Potter
*Assistant Examiner* — Paul Patton
(74) *Attorney, Agent, or Firm* — Scully, Scott, Murphy & Presser, P.C.; Louis J. Peroello, Esq.

(57) ABSTRACT

A semiconductor structure including an electrostatic discharge (ESD) diode with an increased junction area and a vertical field effect transistor (FET) formed on a same substrate is provided. The ESD diode is formed by forming a first doped semiconductor segment merging bottom portions of a pair of semiconductor fins and then forming a second doped semiconductor segment having a conductivity type opposite to that of each of the first doped semiconductor segment and the pair of semiconductor fins. A U-shaped p-n junction is present between the second doped semiconductor segment and the first doped semiconductor segment and the second doped semiconductor segment and the pair of semiconductor fins.

20 Claims, 25 Drawing Sheets

US 9,947,649 B1

LARGE AREA ELECTROSTATIC DISCHAGE FOR VERTICAL TRANSISTOR STRUCTURES

BACKGROUND

The present application relates to semiconductor device fabrication, and more specifically to integration of vertical transistors and electrostatic discharge (ESD) diodes with increased junction areas.

As the advance of semiconductor technology, semiconductor devices are continually becoming more compact and circuit layouts are continually becoming more complex. As a result, semiconductor devices in circuits are more susceptible to burn-out by ESD events. ESD diodes are often required to prevent such burn-out. Since effectiveness of the protection provided by an ESD diode is associated with the junction area of the ESD diode, an ESD diode with larger junction area are desirable.

Vertical field effect transistors (FETs) are attractive candidates for 5 nm node and beyond due to better density scaling and better control of electrostatics. It is therefore desirable to have an improved structure and fabrication process for forming ESD diodes with increased junction areas that are compatible with the formation of vertical FETs.

SUMMARY

The present application provides a structure and fabrication process for forming ESD diodes with increased junction areas that are compatible with the formation of vertical FETs.

According to an embodiment, a semiconductor structure is provided. The semiconductor structure includes an electrostatic discharge (ESD) diode located in a region of a semiconductor substrate. The ESD diode includes a pair of semiconductor fins extends upwards from a portion of a doped bottom semiconductor layer located over the semiconductor substrate, a first doped semiconductor segment adjoined the pair of the semiconductor fins, a second doped semiconductor segment located over the first doped semiconductor segment and laterally contacting an inner sidewall of a channel region of each semiconductor fin in the pair of semiconductor fins, and a top contact segment located over the second doped semiconductor segment.

According to another embodiment, a method of forming a semiconductor structure is provided. The method includes forming a first semiconductor fin extending upwards from a first portion of a doped bottom semiconductor layer and a pair of second semiconductor fins extending from a second portion of the doped bottom semiconductor layer. The first semiconductor fin and the pair of second semiconductor fins are laterally surrounded by a material stack including, from bottom to top, a bottom spacer layer, a sacrificial gate layer, a top spacer layer and a dielectric capping layer, and the pair of second semiconductor fins has a first conductivity type. After removing the dielectric capping layer to exposing a top portion of each of the first semiconductor fin and the pair of the second semiconductor fins located above the top spacer layer, a first doped top semiconductor region is formed laterally surrounding the top portion of the first semiconductor fin and a second doped top semiconductor region is formed laterally surrounding the top portion of each second semiconductor fin. Next, a first sidewall spacer is formed on sidewalls of the first doped top semiconductor region and a second sidewall spacer is formed on sidewalls of each second top semiconductor region. An interlevel dielectric (ILD) layer is then formed laterally surrounding the first sidewall spacer and each second sidewall spacer. Next, after removing a portion of the ILD layer located between the adjacent second sidewall spacers to provide an opening exposing a portion of the top spacer layer, the exposed portion of the top spacer layer and a portion of the sacrificial gate layer and a portion of the bottom spacer layer located between the pair of second semiconductor fins are removed to provide a diode trench underneath the opening. Next, a first doped semiconductor segment of the first conductivity type is formed on a surface of the doped bottom semiconductor layer that is exposed by the diode trench, followed by forming a second doped semiconductor segment of a second conductivity type opposite to the first conductivity type on the first doped semiconductor segment. The second doped semiconductor segment laterally contacts an inner sidewall of a channel portion of each second semiconductor fin previously covered by the removed portion of the sacrificial gate layer.

DETAILED DESCRIPTION

Figure 1:
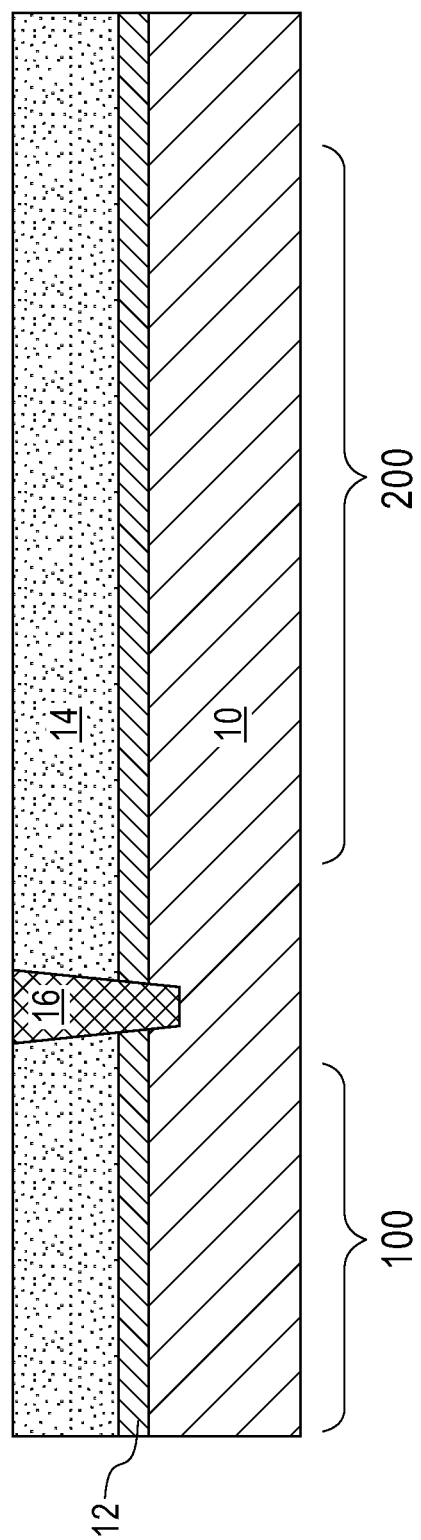
FIG. 1 is a cross-sectional view of a first exemplary semiconductor structure according to a first embodiment of the present application including a stack of, from bottom to top, a semiconductor substrate, a punch through stop (PTS) layer and a doped bottom semiconductor layer, wherein a shallow trench isolation (STI) structure is located within the stack to define a transistor region and a diode region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Reference to FIG. 1, a first exemplary semiconductor structure according to a first embodiment of the present application is shown and includes, from bottom to top, a semiconductor substrate 10, a punch through stop (PTS) layer 12, and a doped bottom semiconductor layer 14. FIG. 1 also shows a shallow trench isolation (STI) structure 16 formed through the doped bottom semiconductor layer 14, the PTS layer 12, and partially into the semiconductor substrate 10. The STI structure is positioned to define a transistor region 100 where vertical FETs are subsequently formed and a diode region 200 where ESD diodes are subsequently formed.

The semiconductor substrate 10 can be a bulk semiconductor substrate including at least one semiconductor material that contiguously extends from the topmost surface of the semiconductor substrate 10 to a bottommost surface of the semiconductor substrate 10 or a top semiconductor material layer of a semiconductor-on-insulator (SOI) substrate. The semiconductor substrate 10 may include any semiconductor material including, for example, Si, Ge, SiGe, SiC, SiGeC, InAs, InP, InAsP, GaAs, and all other III-V or II-VI compound semiconductor materials. In one embodiment of the present application, the semiconductor substrate 10 is composed of silicon. The semiconductor material that provides the semiconductor substrate 10 is typically a single crystalline semiconductor such as, for example, single crystalline silicon.

The PTS layer 12 may include any semiconductor material as mentioned above for the semiconductor substrate 10. In one embodiment of the present application, the PTS layer 12 includes a same semiconductor material as the semiconductor material that provides the semiconductor substrate 10. For example, both the PTS layer 12 and the semiconductor substrate 10 may be composed of silicon. In another embodiment of the present application, the PTS layer 12 includes a different semiconductor material than the semiconductor material that provides the semiconductor substrate 10. For example, the PTS layer 12 may be composed of SiGe and the semiconductor substrate 10 may be composed of silicon.

The PTS layer 12 includes a p-type or an n-type dopant. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The PTS layer 12 may have a dopant concentration ranging from $1 \times 10^{21}$ atoms/cm$^3$ to $1 \times 10^{22}$ atoms/cm$^3$. The thickness of the PTS layer 12 can be from 10 nm to 50 nm, although lesser and greater thicknesses can also be employed.

The PTS layer 12 may be formed within, or on, the semiconductor substrate 10, where the PTS layer 12 is employed to electrically isolate the doped bottom semiconductor layer 14 from the semiconductor substrate 10. In some embodiments, the PTS layer 12 may be formed within the semiconductor substrate 10 by introducing the dopant into an upper portion of the semiconductor substrate 10 using, for example, ion implantation or gas phase doping. In other embodiments, the PTS layer 12 may be formed on top of the semiconductor substrate 10 utilizing an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material layer that is formed by an epitaxial deposition process has the same crystalline characteristics as the deposition surface on which it is formed. For example, an epitaxial semiconductor material layer deposited on a {100} crystal surface will take on a {100} orientation. In the present application, the PTS layer 12 has an epitaxial relationship, i.e., same crystal orientation, as that of the underlying semiconductor substrate 10.

Examples of various epitaxial growth processes that are suitable for use in forming the PTS layer 12 include, e.g., chemical vapor deposition (CVD), molecular beam epitaxy (MBE) and metal-organic chemical vapor deposition (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of the semiconductor material that provides the PTS layer 12. In some embodiments, the source gas for the deposition of the semiconductor material that provides the PTS layer 12 includes a silicon source gas, a germanium source gas or a mixture of a silicon-containing source gas and a germanium-containing source gas. Carrier gases like hydrogen, nitrogen, helium and argon can be used.

In some embodiments, the dopant can be introduced in-situ as the semiconductor material that provides the PTS layer 12 is being deposited, i.e., during the epitaxial growth process. In other embodiments, the dopant can be introduced into the PTS layer 12 after the epitaxial growth process, for example, by ion implantation.

The doped bottom semiconductor layer 14 may include a semiconductor material the same as, or different from, the semiconductor material that provides the PTS layer 12. The doped bottom semiconductor layer 14 is counter-doped with respect to the PTS layer 12 and thus includes a dopant having a conductivity type opposite to that of the dopant in the PTS layer 12. For example, when the PTS layer 12 includes a p-type dopant, the doped bottom semiconductor layer 14 includes an n-type dopant, and when the PTS layer 12 includes an n-type dopant, the doped bottom semiconductor layer 14 includes a p-type dopant. The dopant concentration of the doped bottom semiconductor layer 14 can be from $1 \times 10^{19}$ atoms/cm$^3$ to $1 \times 10^{22}$ atoms/cm$^3$, although lesser and greater dopant concentration can also be employed. In one embodiment, the PTS layer 12 is composed of p-doped silicon, and the doped bottom semiconductor layer 14 is composed of n-doped silicon. A portion of the doped bottom semiconductor layer 14 located in the transistor region 100 may form a source region or a drain region of a FET (herein referred to as a source/drain region), while another portion of the doped bottom semiconductor layer 14 located in the diode region 200 may form an anode or a cathode of a ESD diode (herein referred to as an anode/cathode). It should be noted that a source region and a drain region of a FET may be interchanged depending on the operation of the FET, and an anode and cathode of an ESD diode may be interchanged depending on the doping of the diode segments.

The doped bottom semiconductor layer 14 may be formed using an epitaxial growth process described above in formation of the PTS layer 12. For example, the doped bottom semiconductor layer 14 can be formed by CVD or MBE. The doped bottom semiconductor layer 14 thus has a same crystalline orientation as that of the PTS layer 12. The thickness of the doped bottom semiconductor layer 14 can be from 50 nm to 200 nm, although lesser and greater thicknesses can also be employed.

The STI structure 16 may include a dielectric material such as silicon dioxide, silicon nitride, silicon oxynitride or a combination thereof. In one embodiment, the STI structure 16 may be formed by first forming a shallow trench extending through the doped bottom semiconductor layer 14, the PTS layer 12 and into an upper portion of the semiconductor substrate 10 and then filling the trench with a dielectric material. The shallow trench can be formed by applying a photoresist layer (not shown) over the doped bottom semiconductor layer 14, lithographically patterning the photoresist layer, and transferring the pattern through the doped bottom semiconductor layer 14, the PTS layer 12 and into the upper portion of the semiconductor substrate 10 by at least one etch. The at least one etch can be an anisotropic etch such as reactive ion etch (RIE) or a plasma etch. The dielectric material can be deposited by CVD or physical vapor deposition (PVD). Excess dielectric material can then be removed from above the top surface of the doped bottom semiconductor layer 14, for example, by chemical mechanical planarization (CMP). After planarization, the top surface of the STI structure 16 is coplanar with the top surface of the doped bottom semiconductor layer 14.

Figure 2:
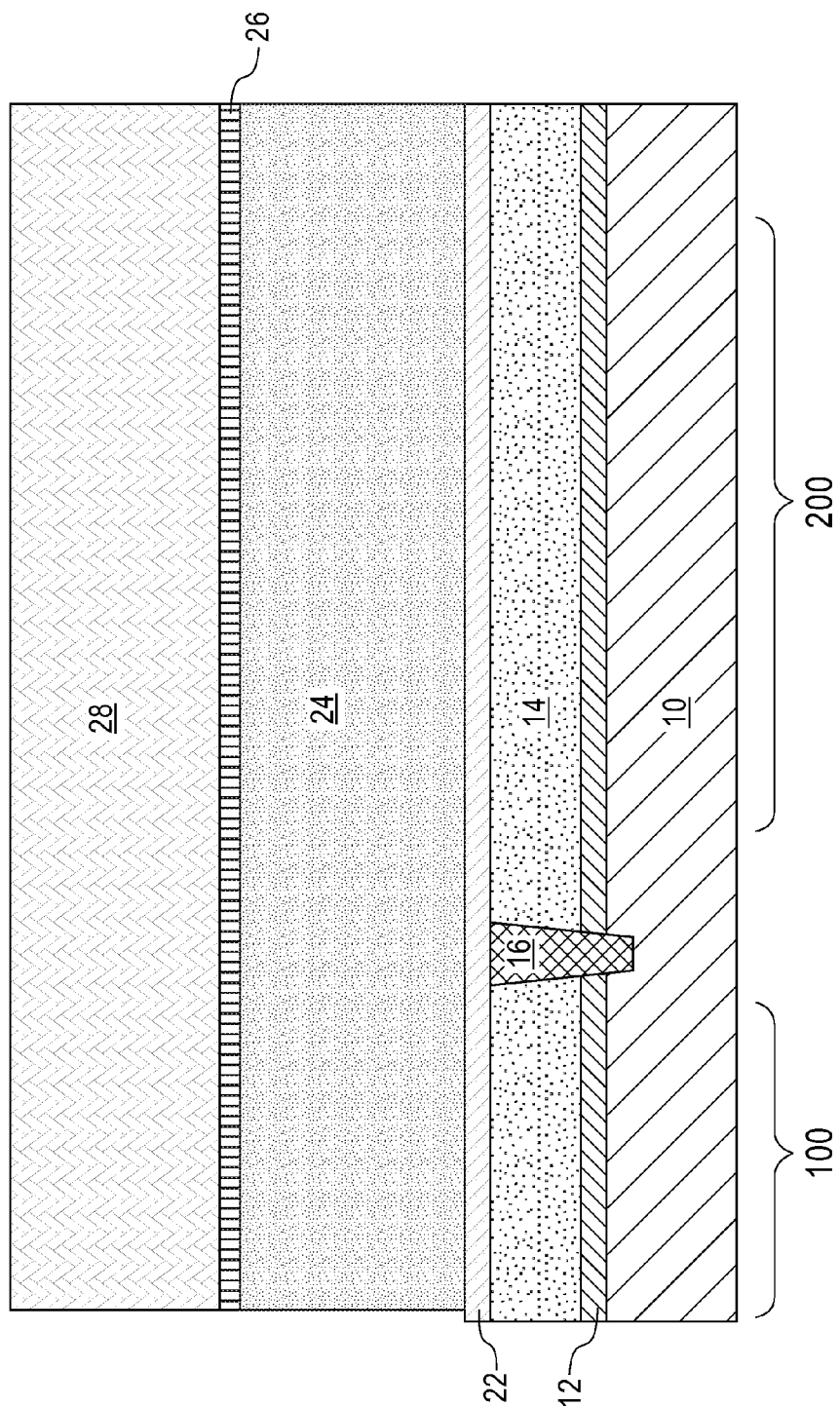
FIG. 2 is a cross-sectional view of the first exemplary semiconductor structure of FIG. 1 after forming a material stack including, from bottom to top, a bottom spacer layer, a sacrificial gate layer, a top spacer layer and a dielectric capping layer on the doped bottom semiconductor layer and the STI structure.

Referring now to FIG. 2, there is illustrated the first exemplary semiconductor structure of FIG. 1 after forming a material stack including, from bottom to top, a bottom spacer layer 22, a sacrificial gate layer 24, a top spacer layer 26 and a dielectric capping layer 28 on the doped bottom semiconductor layer 14 and the STI structure 16.

Each of the bottom spacer layer 22 and the top spacer layer 26 may include a dielectric material such as, for example, silicon nitride or boron nitride. The bottom spacer layer 22 and the top spacer layer 26 may be formed by a deposition process such as, for example, CVD or PVD. The bottom spacer layer 22 and the second spacer layer 26 may each have a thickness from 5 nm to 10 nm, although lesser and greater thicknesses can also be employed.

The sacrificial gate layer 24 may include a semiconductor material such as, for example, amorphous silicon (a-Si) or polycrystalline silicon (polysilicon). The sacrificial gate layer 24 may be formed by a deposition process including, but not limited to, CVD, PVD or plasma enhanced chemical vapor deposition (PECVD). The thickness of the sacrificial gate layer 24 can be from 10 nm to 30 nm, although lesser and greater thicknesses can also be employed.

The dielectric capping layer 28 may include a dielectric oxide such as, for example, silicon dioxide, tetraethylorthosilicate (TEOS) oxide, high aspect ratio plasma (HARP) oxide, high temperature oxide (HTO) or high density plasma (HDP) oxide. The dielectric capping layer 28 may be formed, for example, by CVD or PVD. The thickness of the dielectric capping layer 28 can be from 50 nm to 100 nm, although lesser and greater thicknesses can also be employed.

Figure 3:
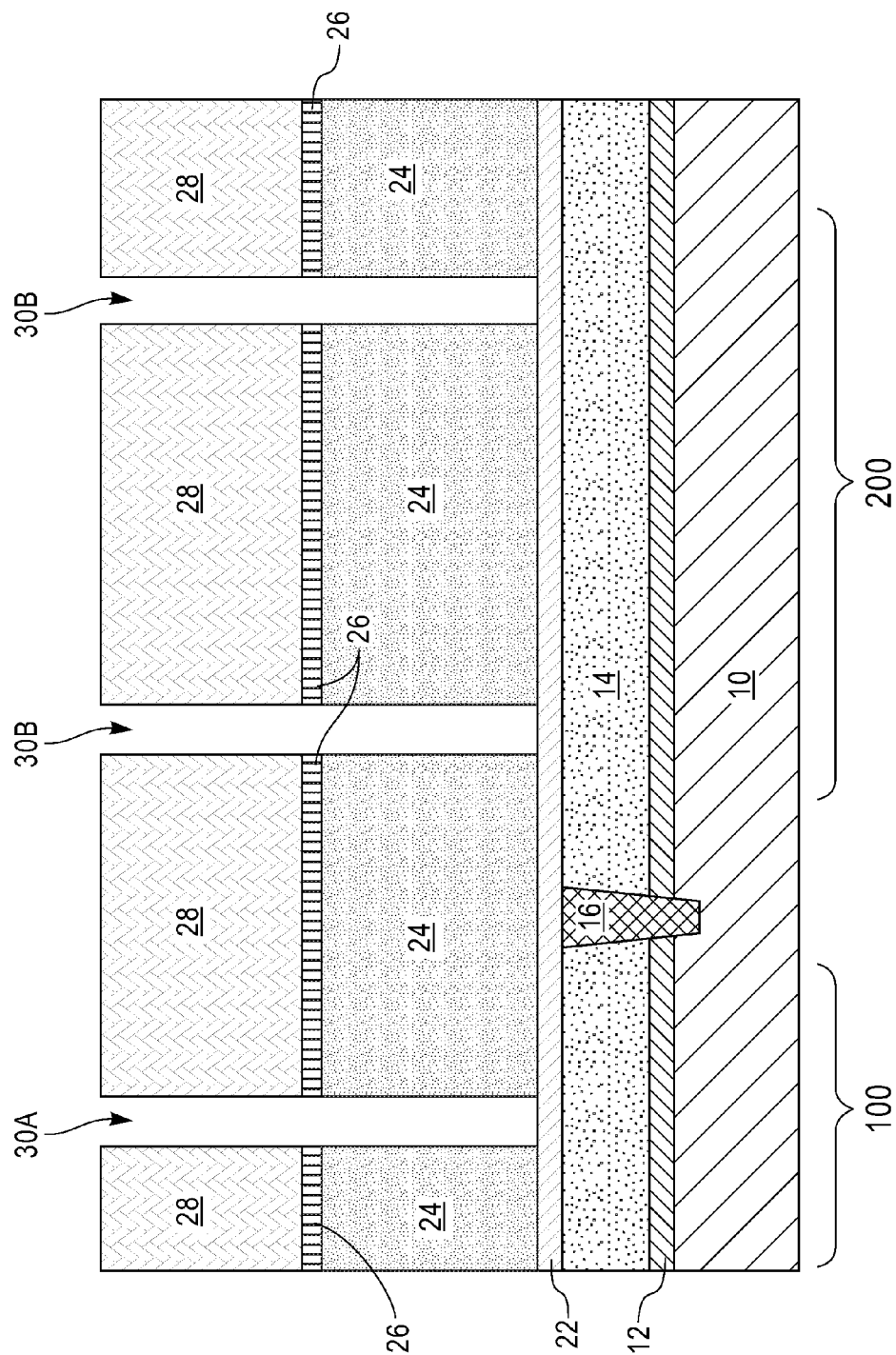
FIG. 3 is a cross-sectional view of the first exemplary semiconductor structure of FIG. 2 after forming one or more first trenches in the transistor region and a plurality of second trenches in the diode region.

Referring now to FIG. 3, there is illustrated the first exemplary semiconductor structure of FIG. 2 after forming one or more first trenches 30A in the transistor region 100 and a plurality of second trenches 30B in the diode region 200. For simplicity, a single first trench 30A and a pair of second trenches 30B are shown in FIG. 3.

Each of the first and second trenches 30A, 30B extends through the dielectric capping layer 28, the top spacer layer 26 and the sacrificial gate layer 24, exposing a surface of the bottom spacer layer 22. The first and second trenches 30A, 30B may be formed by applying a photoresist layer (not shown) over the dielectric capping layer 28 and then lithographically patterning the photoresist layer to form openings therein. The pattern in the photoresist layer is subsequently transferred into the dielectric capping layer 28, the top spacer layer 26 and the sacrificial gate layer 24 to form the first and second trenches 30A, 30B. In one embodiment, multiple etching processes may be performed to sequentially remove portions of the dielectric capping layer 28, the top spacer layer 26 and the sacrificial gate layer 24 that are not covered by the patterned photoresist layer. Each etch can be an anisotropic etch such as, for example, RIE. After formation of the first and second trenches 30A, 30B, the patterned photoresist layer can be removed, for example, by ashing. The width of each first and second trenches 30A, 30B can be from 6 nm to 20 nm, although lesser and greater widths can also be employed. To provide ESD diodes with large surface areas, the pitch of the second trenches 30B in the diode region 200 is set to be greater than the pitch of the first trenches 30A in the transistor region 100. In one embodiment, the pitch of the second trenches 30B is at least two times of the pitch of the first trenches 30A.

Figure 4:
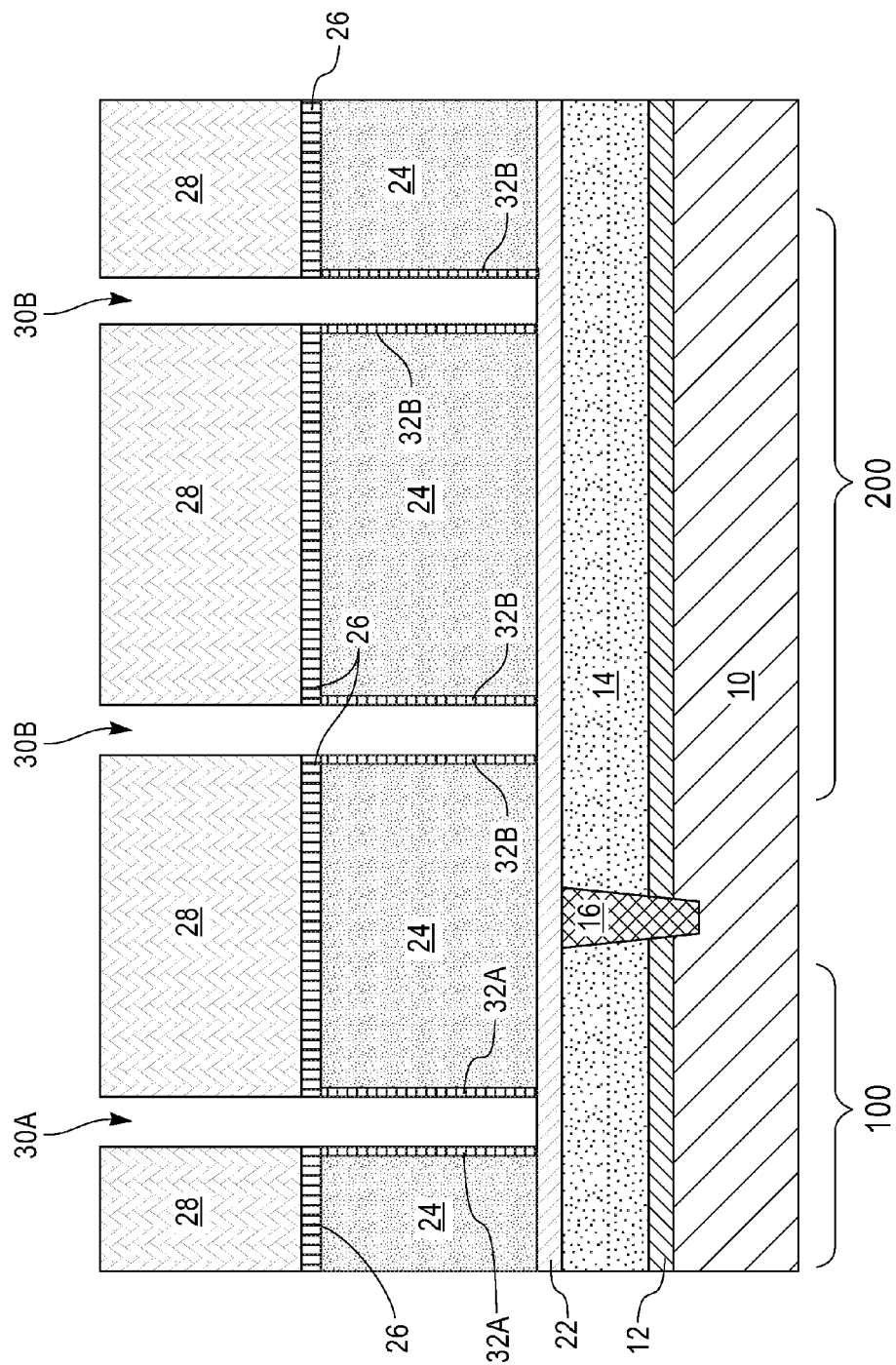
FIG. 4 is a cross-sectional view of the first exemplary semiconductor structure of FIG. 3 after forming a first protective layer on sidewalls of the sacrificial gate layer that are exposed by each first trench and a second protective layer on sidewalls of the sacrificial gate layer that are exposed by each second trench.

Referring now to FIG. 4, there is illustrated the first exemplary semiconductor structure of FIG. 3 after forming a first protective layer 32A on sidewalls of the sacrificial gate layer 24 that are exposed by each first trench 30A and a second protective layer 32B on sidewalls of the sacrificial gate layer 24 that are exposed by each second trench 30B. Each first protective layer 32A and each second protective layer 32B may be formed by oxidizing the exposed portions of the sacrificial gate layer 24. The oxidation may be performed by a plasma oxidation process or other oxidation processes known in the art.

Figure 5:
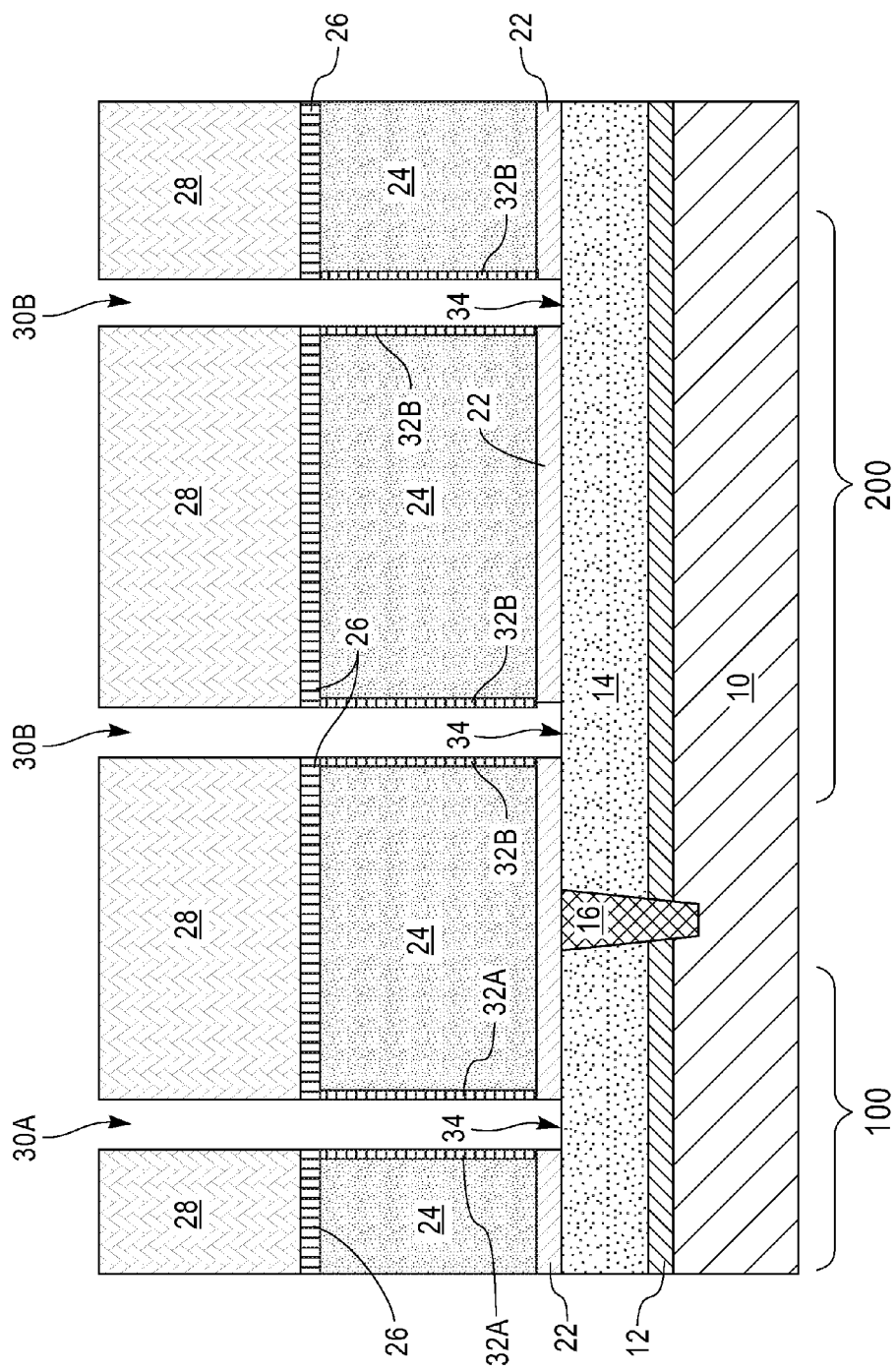
FIG. 5 is a cross-sectional view of the first exemplary semiconductor structure of FIG. 4 after removing a portion of the bottom spacer layer that is physically exposed by each of the first and second trenches.

Referring now to FIG. 5, there is illustrated the first exemplary semiconductor structure of FIG. 4 after removing a portion of the bottom spacer layer 22 that is exposed by each of the first and second trenches 32A, 32B. Each physically exposed portion of the bottom spacer layer 22 may be removed by an anisotropic etch which can be a dry etch such as, for example, RIE or a wet etch. A surface 34 of the underlying doped bottom semiconductor layer 14 is thus physically exposed by each of the first and second trenches 30A, 30B.

Figure 6:
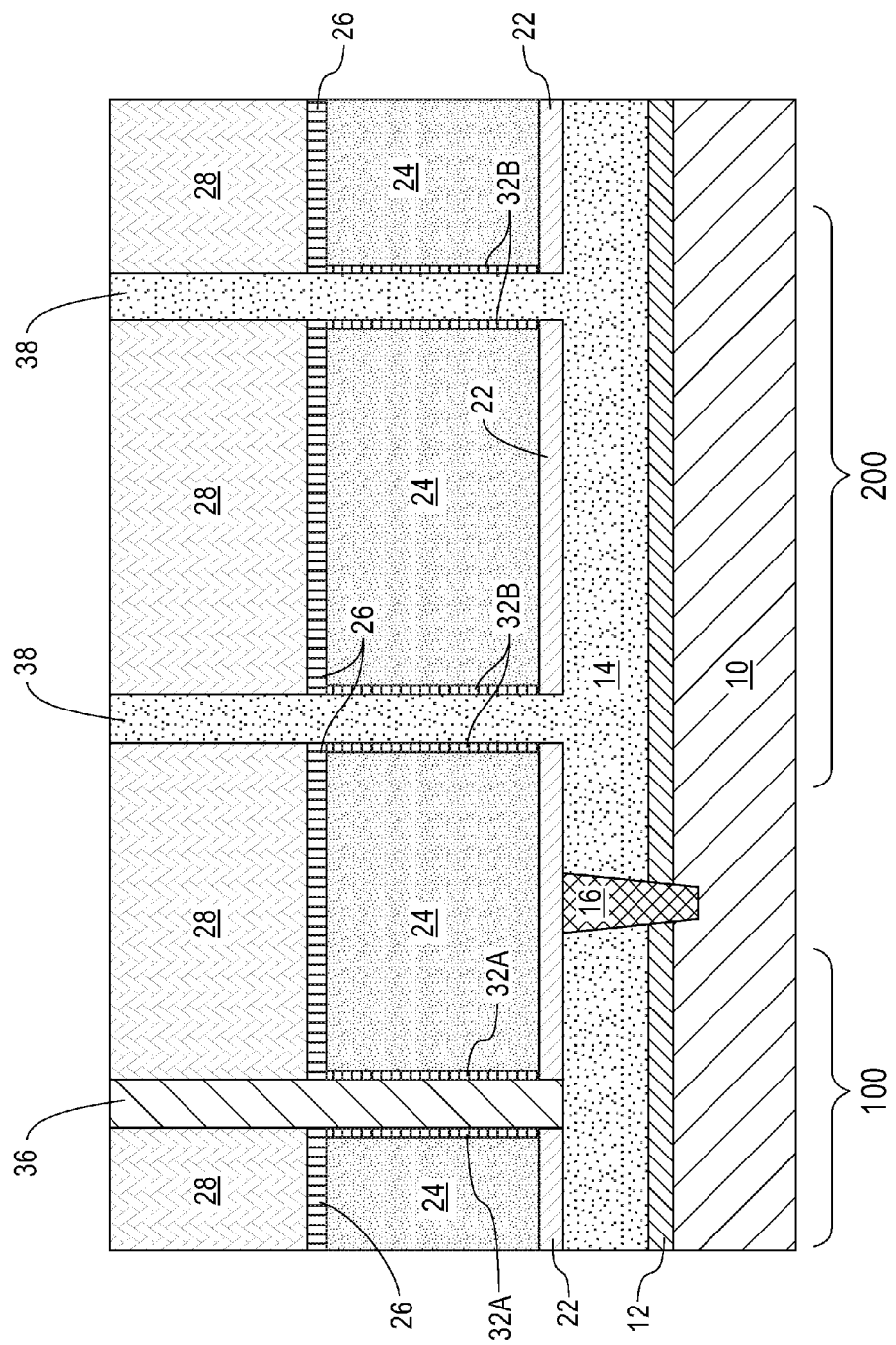
FIG. 6 is a cross-sectional view of the first exemplary semiconductor structure of FIG. 5 after growing a first epitaxial semiconductor fin layer from the surface of the doped bottom semiconductor layer physically exposed by each first trench and a second epitaxial semiconductor fin layer from the physically surface of the doped bottom semiconductor layer exposed by each second trench.

Referring now to FIG. 6, there is illustrated the first exemplary semiconductor structure of FIG. 5 after growing a first epitaxial semiconductor fin layer 36 from the surface 34 of the doped bottom semiconductor layer 14 physically exposed by each first trench 30A, and a second epitaxial semiconductor fin layer 38 from the surface 34 of the doped bottom semiconductor layer 14 physically exposed by each second trench 30B.

Each first epitaxial semiconductor fin layer 36 and each second epitaxial semiconductor fin layer 38 may include any semiconductor material as mentioned above for the semiconductor substrate 10. In one embodiment and when the transistor region 100 is an n-type FET region, the first and second epitaxial semiconductor fin layers 36, 38 may be composed of SiGe or a Group III-V compound semiconductor material such as for example, InAs, GaAs, InP or InGaAs. In another embodiment and when the transistor region 100 is a p-type FET region, the first and second epitaxial semiconductor fin layers 36, 38 may be composed of silicon.

The first and second epitaxial semiconductor fin layers 36, 38 may be formed by a selective epitaxial growth process. The selective epitaxial growth process deposits the semiconductor material that provides the first and second epitaxial semiconductor fin layers 36, 38 only on the semiconductor surface (i.e., physically exposed surfaces of the doped bottom semiconductor layer 14), but not on dielectric surfaces, such as the bottom and top spacer layers 22, 26, the dielectric capping layer 28 and the first and second protective layers 32A, 32B. In one embodiment, the first and second epitaxial semiconductor fin layers 36, 38 are formed by metal-organic chemical vapor deposition (MOCVD).

After the selective epitaxial growth processes, a planarization process such as, for example, CMP may be performed to remove deposited semiconductor material from the top surface of the dielectric capping layer 28. A top surface of each of the first and second epitaxial semiconductor fin layers 36, 38 is thus coplanar with the top surface of the dielectric capping layer 28.

Subsequently, each second epitaxial semiconductor fin layer 38 is doped to a conductivity type the same as the conductivity type of the doped bottom semiconductor layer 14. For example, the doped bottom semiconductor layer 14 and the second epitaxial semiconductor fin layer 38 may each have an n-type conductivity. In one embodiment, an ion implantation process may be performed to introduce the dopant into each second epitaxial semiconductor fin layer 38 while masking the transistor region 100.

It should be noted that although FIG. 3 of the present application illustrates that the first and second trenches 30A, 30B for formation of first and second epitaxial semiconductor fin layers 36, 38 are formed at the same time, the first and second trenches 30A, 30B can also be formed separately such that the second trenches 30B can be formed after formation of the first epitaxial semiconductor layer 36 within each first trench 30A.

Figure 7:
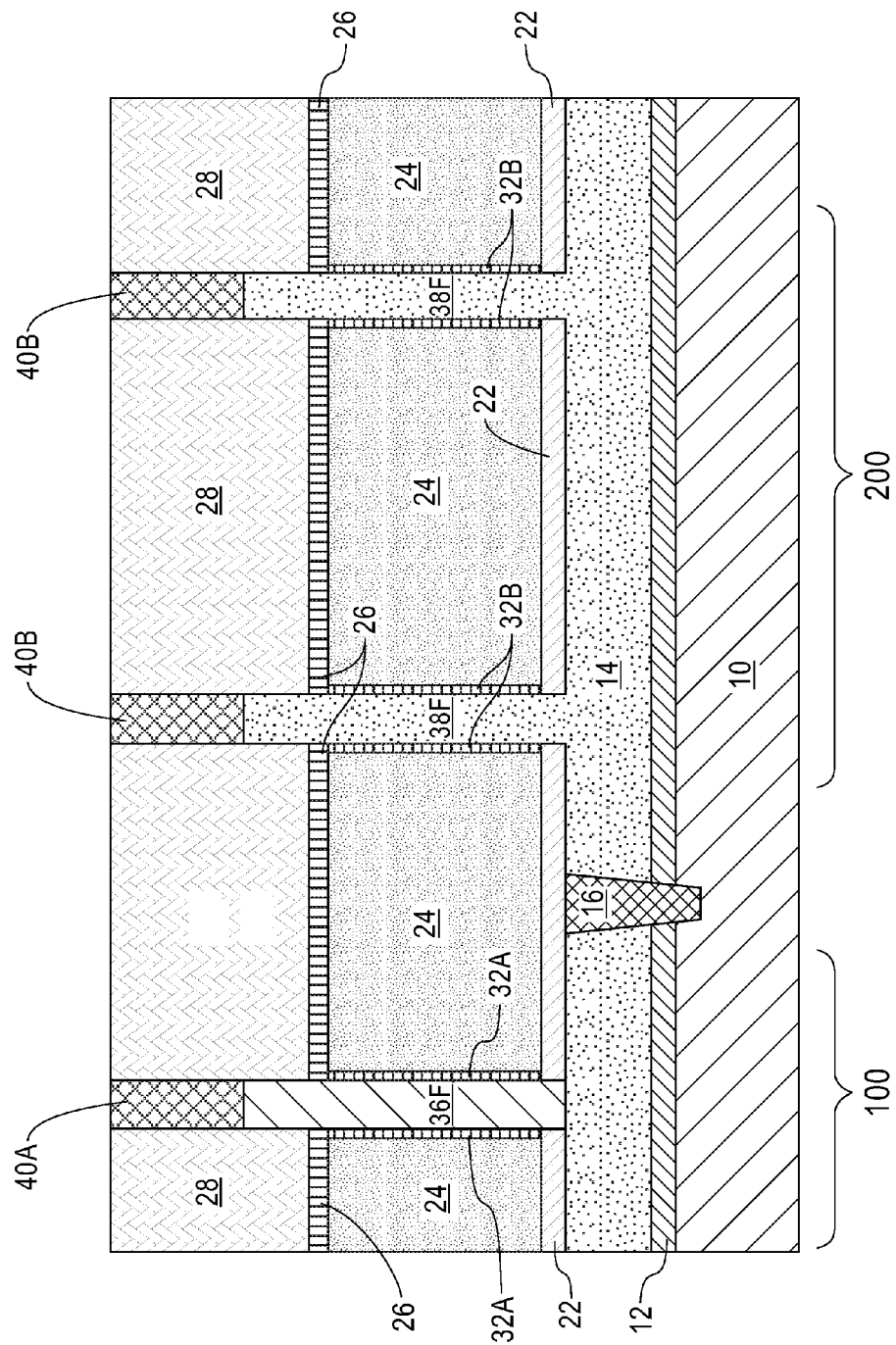
FIG. 7 is a cross-sectional view of the first exemplary semiconductor structure of FIG. 5 after forming a first semiconductor fin within each first trench and a second semiconductor fin within each second trench, and forming a first dielectric cap atop each first semiconductor fin and a second dielectric cap atop each second semiconductor fin.

Referring now to FIG. 7, there is illustrated the first exemplary semiconductor structure of FIG. 6 after recessing each first epitaxial semiconductor fin layer 36 and each second epitaxial semiconductor fin layer 38 to form a first semiconductor fin 36F with each first trench 32A and a second semiconductor fin 38F within each second trench 32B, and then forming a first dielectric cap 40A atop each first semiconductor fin 36F and a second dielectric cap 40B atop each second semiconductor fin 38F.

Each first epitaxial semiconductor fin layer 36 and each second epitaxial semiconductor fin layer 38 may be recessed by an anisotropic etch. The etch can be a dry etch such as RIE or a wet etch which recesses the first and second epitaxial semiconductor fin layers 36, 38 selective to the dielectric capping layer 28. After etching, a remaining portion of each first epitaxial semiconductor fin layer 36 constitutes the first semiconductor fin 36F, and a remaining portion of each second epitaxial semiconductor fin layer 38 constitutes the second semiconductor fin 38F. A top surface of each of the first and second semiconductor fins 36F, 38F is located between the top surface of the dielectric capping layer 28 and the bottom surface of the dielectric capping layer 28. Thus, a first void (not shown) is formed over the first semiconductor fin 36F within each first trench 30A, and a second void (not shown) is formed over the second semiconductor fin 38F within each second trench 30B.

Next, a dielectric material is deposited to fill each first void and each second void. The dielectric material may be a dielectric oxide (e.g., silicon dioxide), a dielectric nitride (e.g., silicon nitride), a dielectric oxynitride, or any combination thereof. The dielectric material may be deposited by a deposition process such as, for example, CVD or PVD. After deposition, the excess dielectric material can be removed from the top surface of the dielectric capping layer 28 by a planarization process such as, for example, by CMP, thus providing the first and second dielectric caps 40A, 40B. The top surfaces of the first and second dielectric caps 40A, 40B are coplanar with the top surface of the dielectric capping layer 28.

Figure 8:
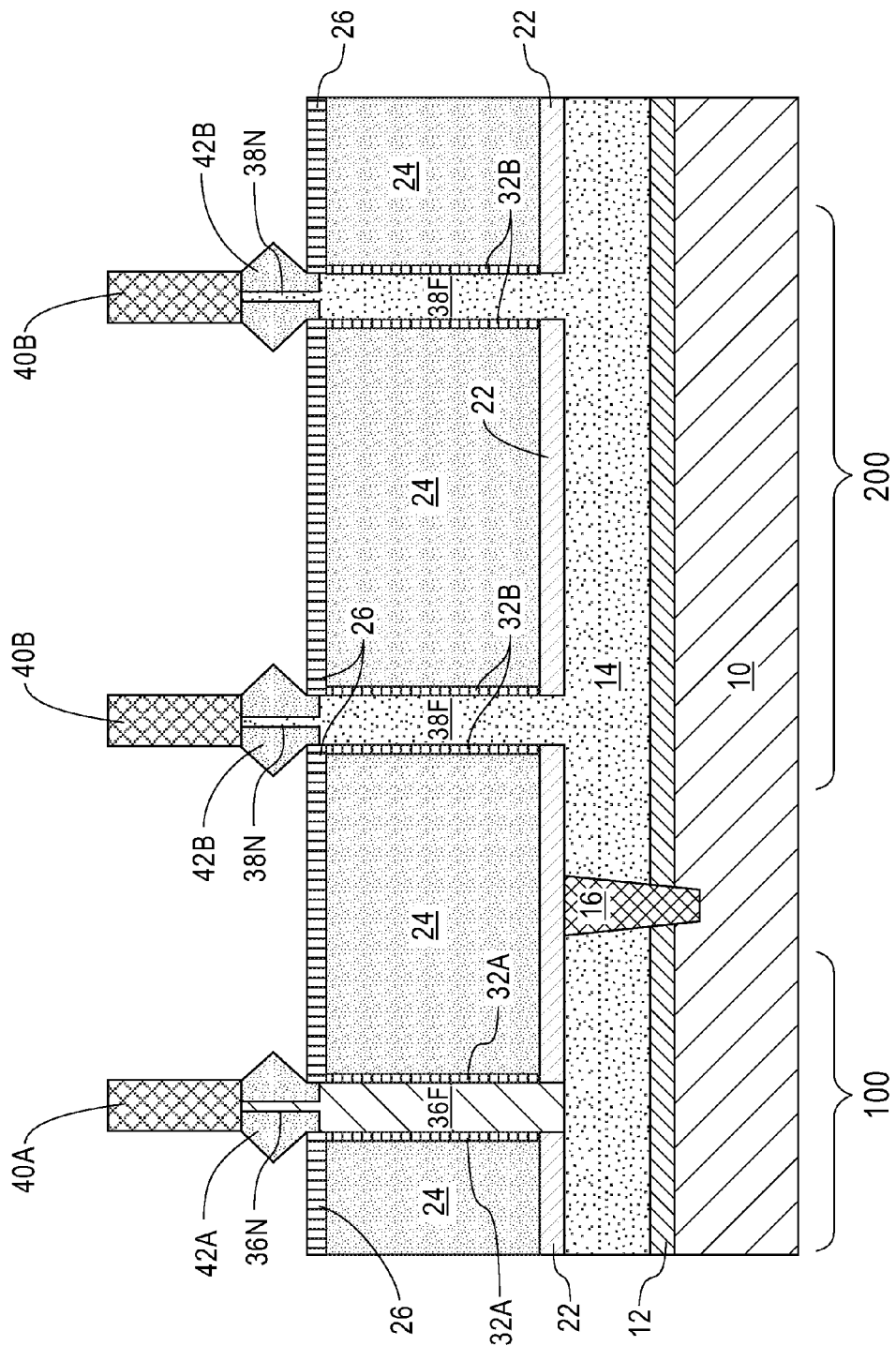
FIG. 8 is a cross-sectional view of the first exemplary semiconductor structure of FIG. 9 after removing the dielectric capping layer and forming a first doped top semiconductor region on sidewalls of a top portion of each first semiconductor fin and a second doped top semiconductor region on sidewalls of a top portion of each second semiconductor fin.

Referring now to FIG. 8, there is illustrated the exemplary semiconductor structure of FIG. 7 after removing the dielectric capping layer 28 and then forming a first doped top semiconductor region 42A on sidewalls of the exposed top portion of each first semiconductor fin 36F and a second doped top semiconductor region 42B on sidewalls of the exposed top portion of each second semiconductor fin 38F.

The dielectric capping layer 28 may be removed by an etch. The etch can be an isotropic etch or an anisotropic etch that removes the dielectric capping layer 28 selective to the top spacer layer 26, the first and second dielectric caps 40A, 40B and the first and second semiconductor fins 36F, 38F. In one embodiment, a wet etch process using diluted hydrofluoric acid can be performed to remove the dielectric capping layer 28. The removal of the dielectric capping layer 28 exposes sidewalls of the first and second dielectric caps 40A, 40B and sidewalls of a top portion of each of the first and second semiconductor fins 36F, 38F that were previously covered by the dielectric capping layer 28.

A lateral etch is then performed to narrow the exposed top portion of each of the first and second semiconductor fins 36F, 38F to provide a first narrowed top portion 36N within each first semiconductor fin 36F and a second narrowed top portion 38N within each second semiconductor fin 38F. In one embodiment, the first and second narrowed portions 36N, 38N may have a width ranging from 2 nm to 5 nm. The lateral etch can be, for example, a wet etch. In some embodiments, the lateral etch may also remove a portion of each of the first and second semiconductor fins 36F, 38F located below the top surface of the top spacer layer 26. A bottom surface of each of the first and second narrowed top portions 36N, 38N is thus located between the top surface of the top spacer layer 26 and the bottom surface of the top spacer layer 26.

The first and second doped top semiconductor regions 42A, 42B are then formed on sidewalls of the first and second narrowed top portions 36N, 38N, respectively. Each of the first and second doped top semiconductor regions 42A, 42B may include a semiconductor material that is the same as, or different from, the semiconductor material that provides the doped bottom semiconductor layer 14. Each of the first and second doped top semiconductor regions 42A, 42B also contains a dopant having a conductivity type the same as that of the doped bottom semiconductor layer 14.

The first and second doped top semiconductor regions 42A, 42B can be formed utilizing a selective epitaxial growth process described above in formation of the first and second epitaxial semiconductor fin layers 36, 38. As shown, the first and second doped top semiconductor regions 42A, 42B may be formed with faceted surfaces. In some embodiments, the first and second doped top semiconductor regions 42A, 42B are triangular in shape with the base of the triangle located on the first and second narrowed top portions 36N, 38N, respectively, and the tip extending laterally outward from the first and second narrowed top portions 36N, 38N, respectively. The dopant can be provided during the epitaxial growth process by in-situ doping, or after epitaxial growth process by ion implantation or gas phase doping. The dopant concentration can be from $1 \times 10^{19}$ atoms/cm$^3$ to $1 \times 10^{22}$ atoms/cm$^3$.

Figure 9:
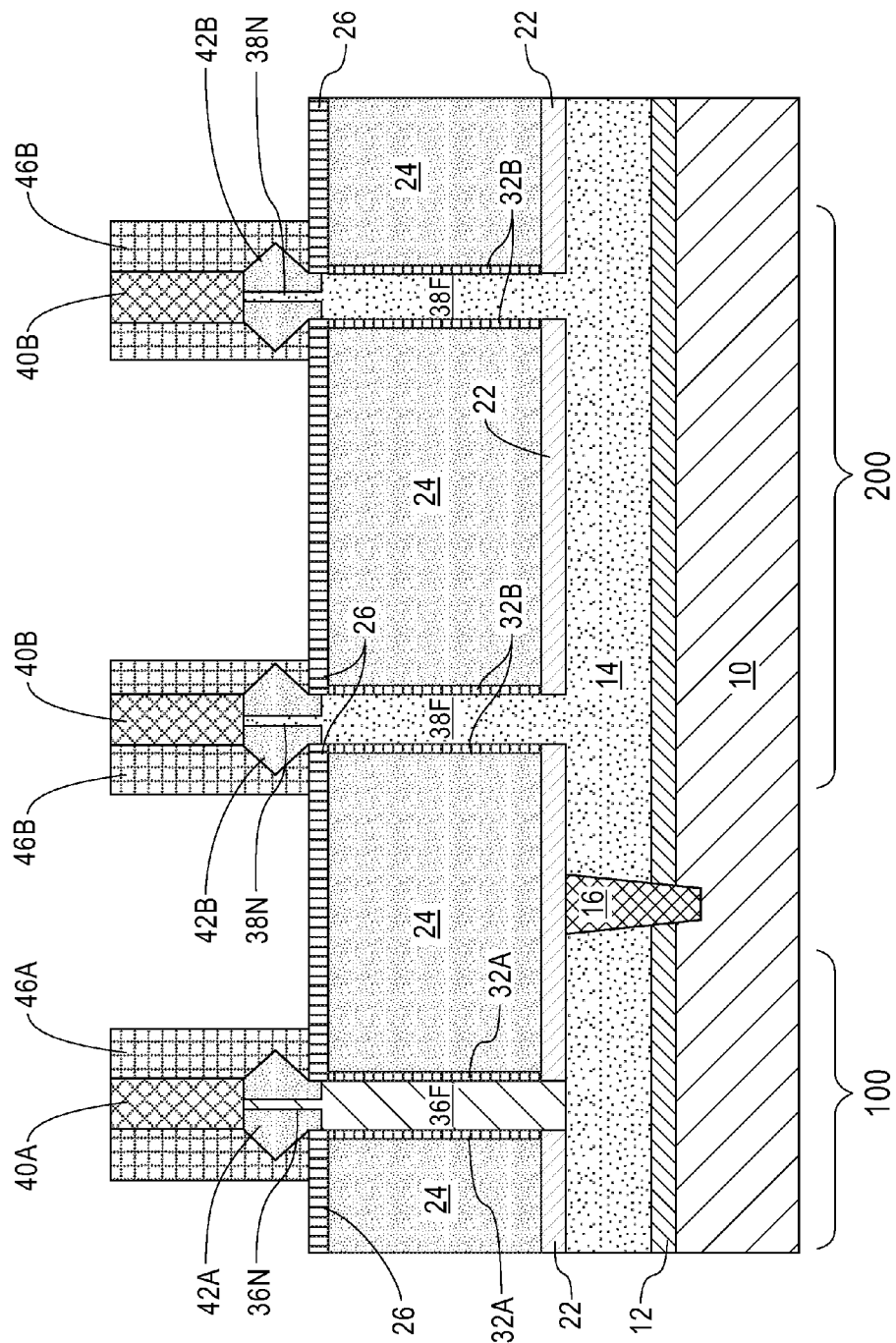
FIG. 9 is a cross-sectional view of the first exemplary semiconductor structure of FIG. 8 after forming a first sidewall spacer laterally surrounding each first doped top semiconductor region and a second sidewall spacer laterally surrounding each second doped top semiconductor region.

Referring now to FIG. 9, there is illustrated the first exemplary semiconductor structure of FIG. 8 after forming a first sidewall spacer 46A and a second sidewall spacer 46B on sidewalls of each vertical stack of the first doped top semiconductor region 42A and the first dielectric cap 40A as well as on sidewalls of each vertical stack of the second doped top semiconductor region 42B and the second dielectric cap 40B, respectively.

The first and second sidewall spacers 46A, 46B may include a dielectric material such as, for example, silicon dioxide, silicon nitride, silicon oxynitride or a combination of. In one embodiment, each of the first and second sidewall spacers 46A, 46B is composed of silicon nitride. The first and second sidewall spacers 46A, 46B may be formed by conformally depositing a dielectric material on the physically exposed surfaces of the top spacer layer 26, the first and second doped top semiconductor regions 46A, 46B and the first and second dielectric caps 40A, 40B using, for example, CVD or atomic layer deposition (ALD). Horizontal portions of the deposited dielectric material are subsequently removed, for example, by an anisotropic etch. The anisotropic etch can be a dry etch such as, for example, RIE or a wet etch. After etching, remaining vertical portions of the deposited dielectric material present on the sidewall surfaces of the first and second doped top semiconductor regions 46A, 46B and the first and second dielectric caps 40A, 40B constitute the first and second sidewall spacers 46A, 46B. The width of each of the first and second sidewall spacers 46A, 46B, as measured from its base, can be from 5 nm to 25 nm, although lesser and greater widths can also be employed. As shown, a bottom surface of each of the first and second sidewall spacer 46A, 46B is in direct contact with the top surface of the top spacer layer 26.

Figure 10:
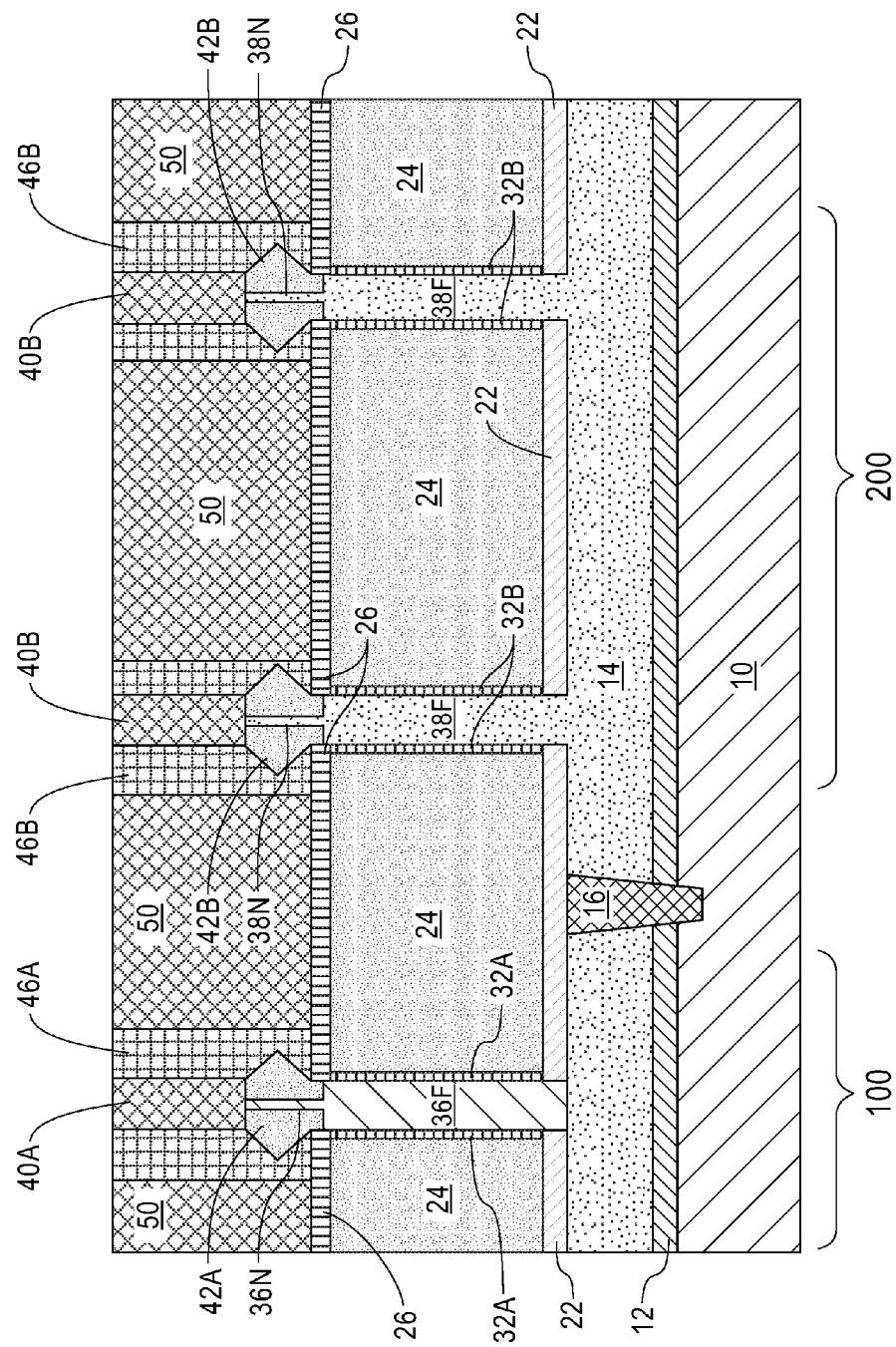
FIG. 10 is a cross-sectional view of the first exemplary semiconductor structure of FIG. 9 after forming an interlevel dielectric (ILD) layer on the top spacer layer to laterally surrounding the first and second sidewall spacers.

Referring now to FIG. 10, there is illustrated the first exemplary semiconductor structure of FIG. 9 after forming an interlevel dielectric (ILD) layer 50 on the top spacer layer 26. The ILD layer 50 laterally surrounds the first and second sidewall spacers 46A, 46B. The ILD layer 50 may be formed from, for example, a low-k dielectric material (with k<4.0), including but not limited to, silicon oxide, spin-on-glass, a flowable oxide, a high density plasma oxide, borophosphosilicate glass (BPSG) or any combination thereof. The ILD layer 50 may be deposited, for example, by CVD, PVD or spin coating. The ILD layer 50 can be initially formed such that an entirety of the top surface of the ILD layer 50 is formed above the top surfaces of the first and second dielectric caps 40A, 40B. The ILD layer 50 can be subsequently planarized, for example, by CMP and/or a recess etch using the first and second dielectric caps 40A, 40B as a polishing and/or an etch stop. After planarization, the top surface of the ILD layer 50 is coplanar with the top surfaces of the first and second dielectric caps 40A, 40B.

Figure 11:
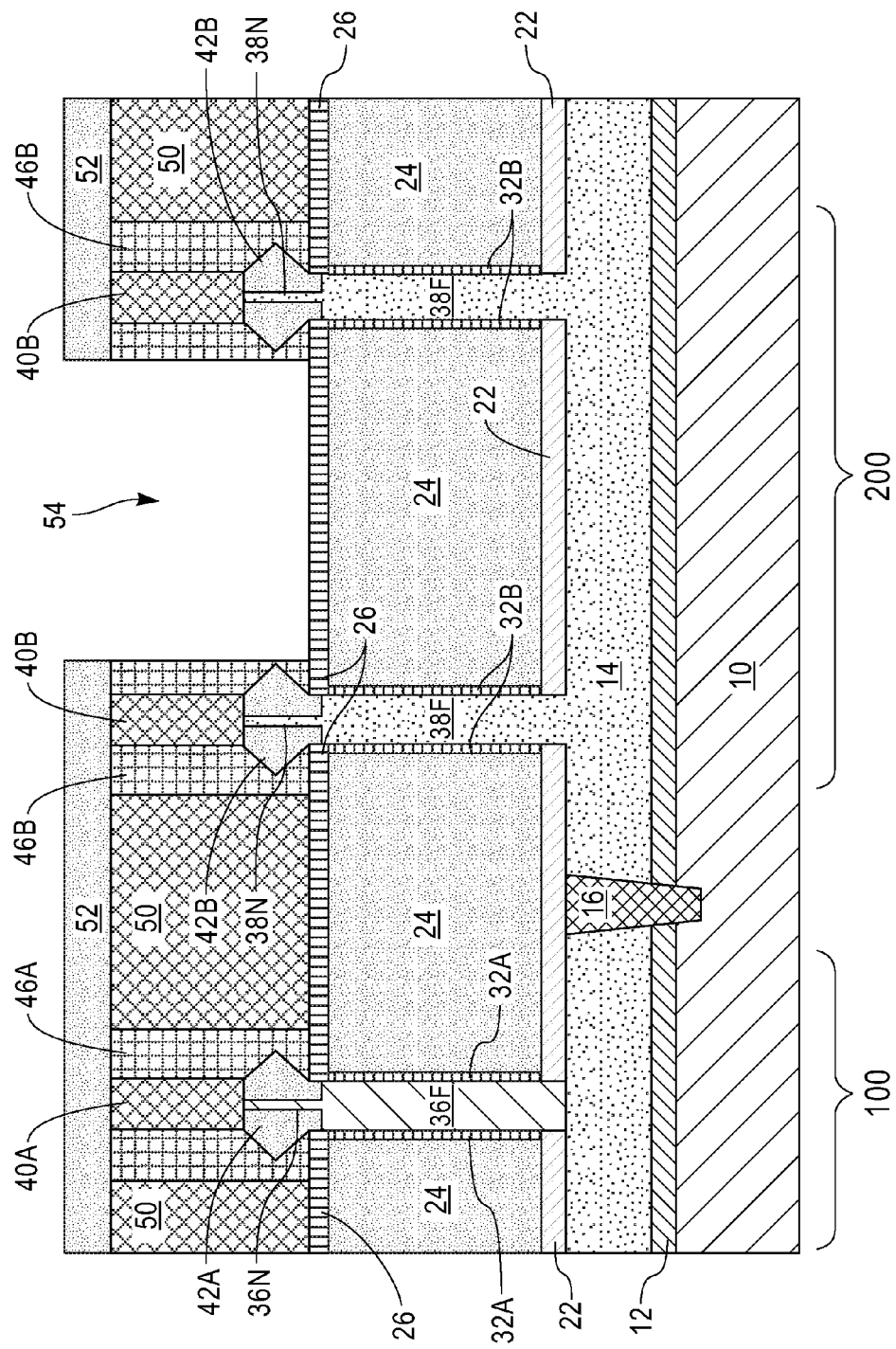
FIG. 11 is a cross-sectional view of the first exemplary semiconductor structure of FIG. 10 after removing a portion of the ILD layer located between each pair of adjacent second sidewall spacers in the diode region to provide an opening.

Referring now to FIG. 11, there is illustrated the first exemplary semiconductor structure of FIG. 10 after removing a portion of the ILD layer 50 located between each pair of adjacent second sidewall spacers 46B in the diode region 200. A first mask layer (not shown) may be first applied on the top surfaces of the ILD layer 50, the first and second sidewall spacers 46A, 46B and the first and second dielectric caps 40A, 40B and then lithographically patterned to provide a first patterned mask layer 52. The patterned first mask layer 52 exposing a portion of the ILD layer 50 located between each pair of adjacent second sidewall spacers 46B. The first mask layer may be a photoresist layer or a photoresist layer in conjunction with hard mask layer(s). Subsequently, each physically exposed portion of the ILD layer 50 that is not covered by the first patterned mask layer 52 is removed by an etch. The etch can be an isotropic etch or an anisotropic etch that removes the ILD layer 50 selective to the first and second sidewall spacers 46A, 46B and the top spacer layer 26. After etching, an opening 54 is provided between each pair of adjacent second sidewall spacers 46B, exposing a portion of the top spacer layer 26.

Figure 12:
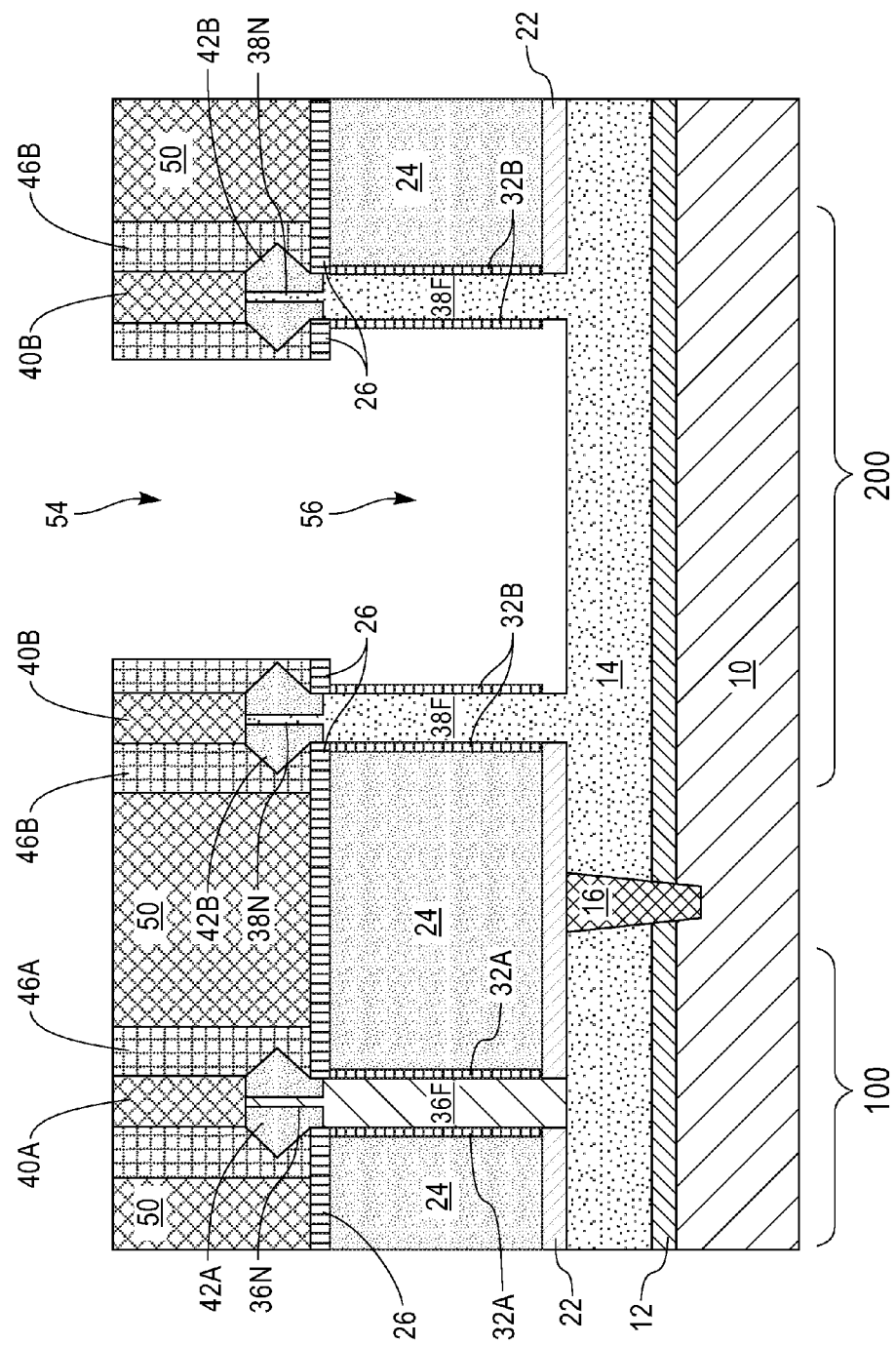
FIG. 12 is a cross-sectional view of the first exemplary semiconductor structure of FIG. 11 after sequentially removing a portion of the top spacer layer exposed by each opening and the underlying portion of each of the sacrificial gate layer and the bottom spacer layer located between each pair of adjacent second semiconductor fins to provide a diode trench beneath each opening.

Referring now to FIG. 12, there is illustrated the first exemplary semiconductor structure of FIG. 11 after sequentially removing a portion of the top spacer layer 26 exposed by each opening 54 and the underlying portion of each of the sacrificial gate layer 24 and the bottom spacer layer 22 located between each pair of adjacent second semiconductor fins 38F.

Each physically exposed portion of the second spacer layer 26 may be removed by an anisotropic etch. The anisotropic etch can be a dry etch such as, for example, RIE or a wet etch that removes the second spacer layer 26 selective to the second sidewall spacers 46B and the sacrificial gate layer 24. The removal of each physically exposed portion of the second spacer layer 26 exposes an underlying portion of the sacrificial gate layer 24.

Each physically exposed portion of the sacrificial gate layer 24 may then be removed by an isotropic etch which can be a dry etch or a wet etch. In one embodiment, a wet etch including hot ammonia is employed to remove each exposed portion of the sacrificial gate layer 24. The removal of the exposed portions of sacrificial gate layer 24 exposes the underlying bottom spacer layer 22.

Subsequently, another isotropic etch may be performed to remove the physically exposed portions of the bottom spacer layer 22 in the diode region 200. A diode trench 56 is thus provided underneath the opening 54. The diode trench 56 exposes a portion of the doped bottom semiconductor layer 14 between each pair of adjacent second semiconductor fins 38F. After etching, the first patterned mask layer 52 can be removed, for example, by oxygen-based plasma etching.

Figure 13:
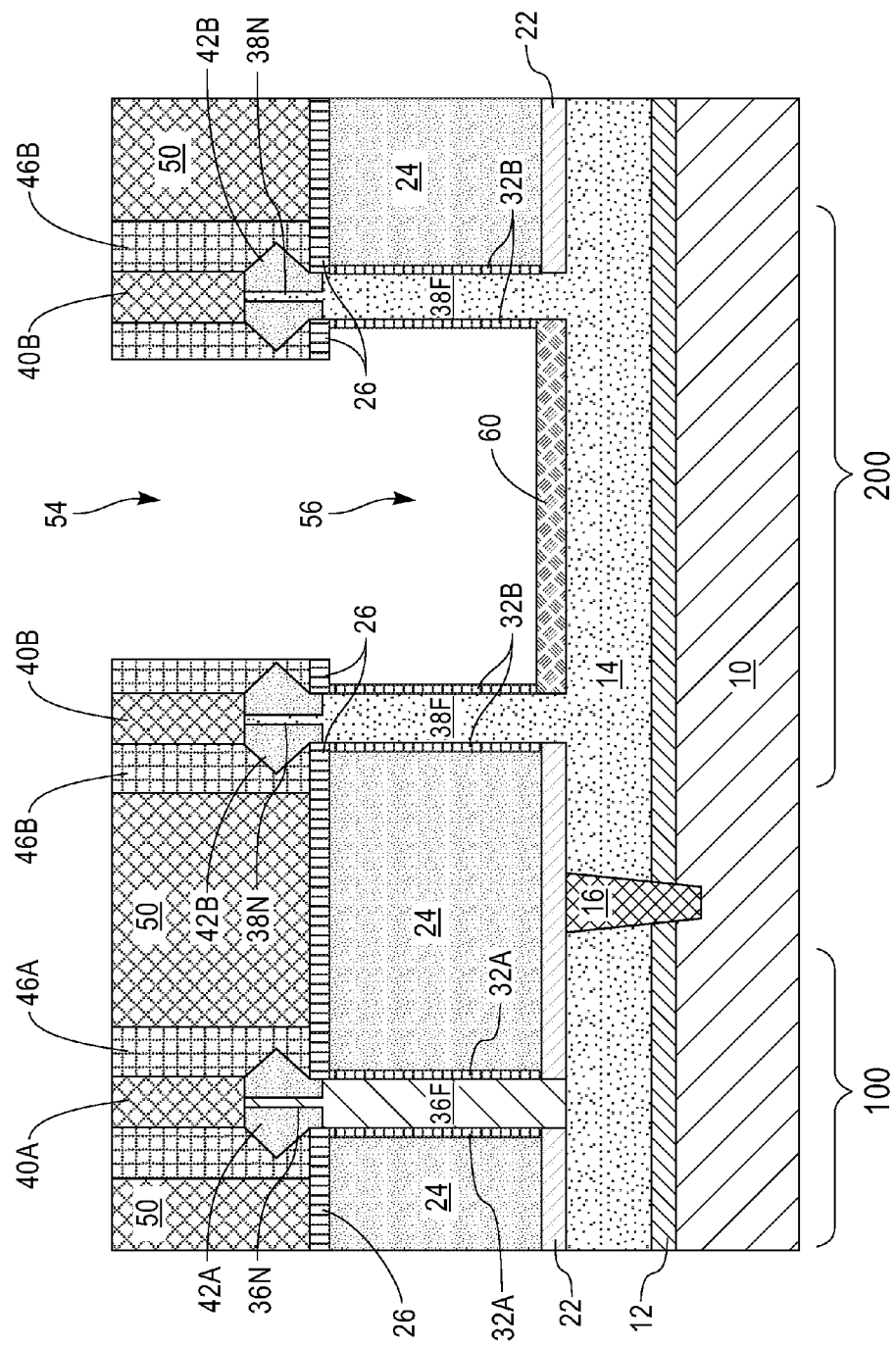
FIG. 13 is a cross-sectional view of the first exemplary semiconductor structure of FIG. 12 after forming a first doped semiconductor segment on a portion of the doped bottom semiconductor layer exposed by each diode trench.

Referring now to FIG. 13, there is illustrated the exemplary semiconductor structure of FIG. 12 after forming a first doped semiconductor segment 60 on the physically exposed portion of the doped bottom semiconductor layer 14 within each diode trench 56. The first doped semiconductor segment 60 merges two adjacent second semiconductor fins 38F. The first doped semiconductor segment 60 may include a semiconductor material the same as, or different from, the semiconductor material that provides the doped bottom semiconductor layer 14. For example, the first doped semiconductor segment 60 may be composed of Si or SiGe. The first doped semiconductor segment 60 also contains a dopant having the same conductivity type as that of the dopant in the doped bottom semiconductor layer 14.

The first doped semiconductor segment 60 may be formed by a selective epitaxial growth process described above in formation of the first and second epitaxial semiconductor fin layers 36, 38. The dopant can be provided during the epitaxial growth process by in-situ doping, or after epitaxial growth process by ion implantation or gas phase doping. The dopant concentration can be from $1\times10^{19}$ atoms/cm$^3$ to $1\times10^{22}$ atoms/cm$^3$. In some embodiments, a timed epitaxial growth process can be used such that the deposition only partially fills the diode trench 56. A recess etch may them be used to remove a topmost portion of the deposited semiconductor material so as to provide the first doped semiconductor segment 60. A top surface of the first doped semiconductor segment 60 is thus located above, coplanar or below the top surface of the bottom spacer layer 22.

Figure 14:
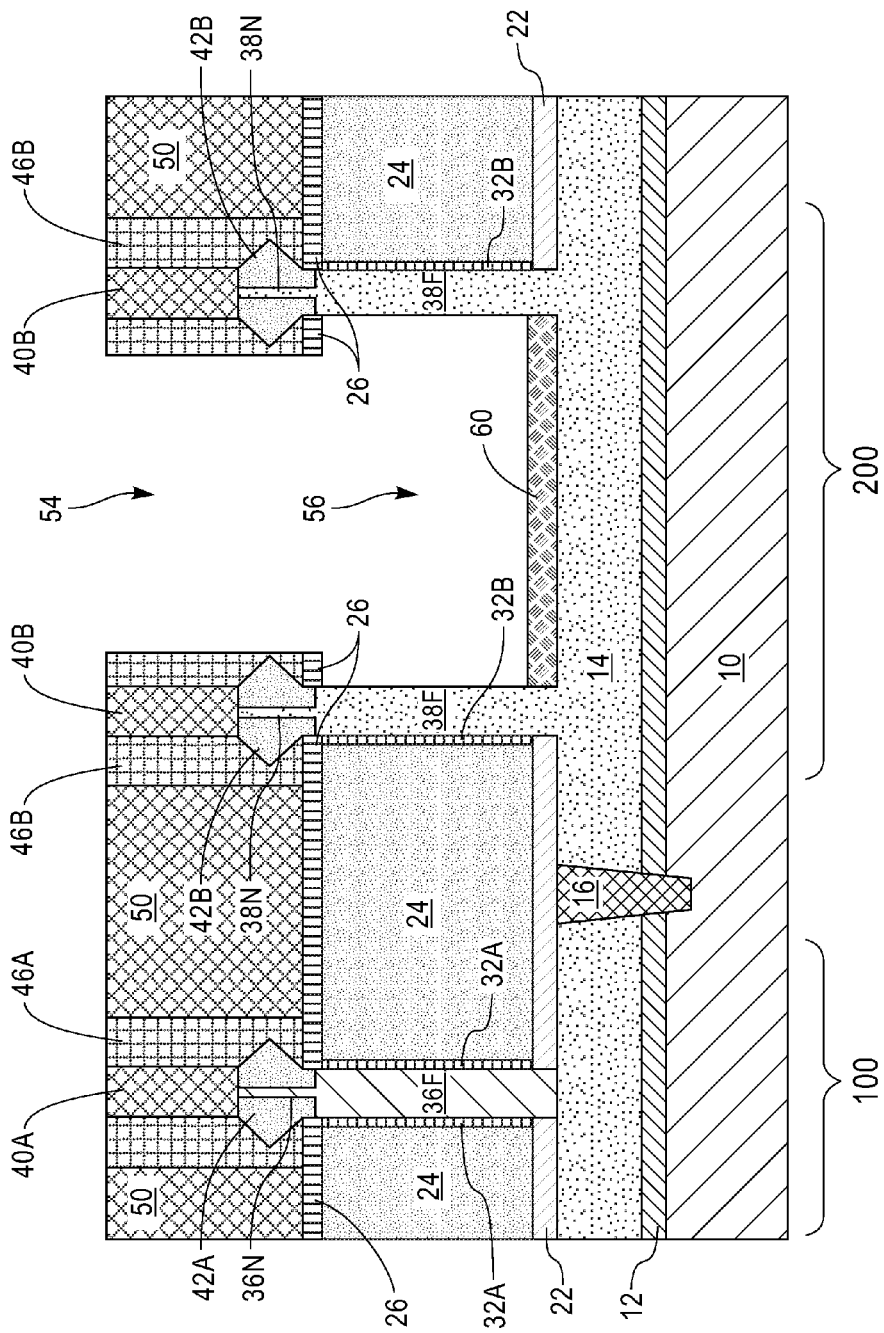
FIG. 14 is a cross-sectional view of the first exemplary semiconductor structure of FIG. 13 after removing a portion of each second protective layer that is present on an inner sidewall of each second semiconductor fin exposed by each diode trench.

Referring now to FIG. 14, there is illustrated the first exemplary semiconductor structure of FIG. 13 after removing a portion of each second protective layer 32B that is present on an inner sidewall of each second semiconductor fin 38F exposed by each diode trench 56. In one embodiment, an isotropic etch may be performed to remove the physically exposed portion of each second protective layer 32B. The etch can be a dry etch such as, for example, RIE or a wet etch that removes the oxide of the second protective layer 32B selective to the first and second dielectric caps 40A, 40B, the second sidewall spacers 46A, 46B, the top spacer layer 26, the second semiconductor fins 38F and the firs doped semiconductor segment 60. In another embodiment, the physically exposed portion of each second protective layer 32B may be removed during a pre-clean process performed prior to a selective epitaxy growth process subsequently performed. The removal of the exposed portion of each second protective layer 22B exposes inner sidewalls of each two adjacent second semiconductor fins 38F. As used herein, for two adjacent semiconductor fins that are laterally spaced from each other along a widthwise direction of the semiconductor fins, inner sidewalls of the two adjacent semiconductor fins refers to two lengthwise sidewalls of the two adjacent semiconductor fins that are facing each other.

Figure 15:
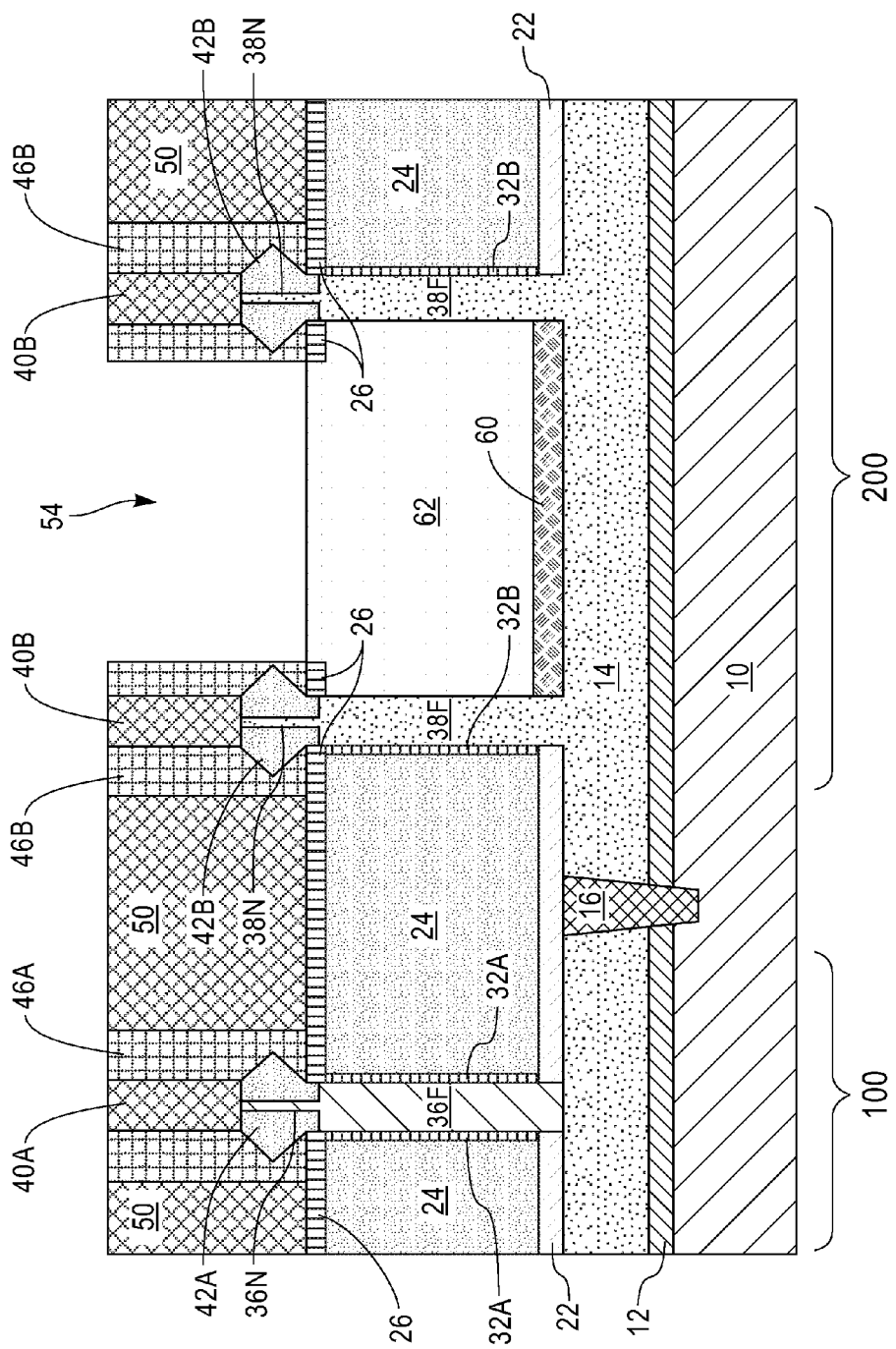
FIG. 15 is a cross-sectional view of the first exemplary semiconductor structure of FIG. 14 after forming a second doped semiconductor segment on each first doped semiconductor segment.

Referring now to FIG. 15, there is illustrated the first exemplary semiconductor structure of FIG. 14 after forming a second doped semiconductor segment 62 on each first doped semiconductor segment 60. The second doped semiconductor segment 62 may include a semiconductor material the same as, or different from, the semiconductor material that provides the first doped semiconductor segment 60. For example, the second doped semiconductor segment 62 may be composed of Si or SiGe. The second doped semiconductor segment 62 also contains a dopant having a conductivity type opposite to that of the dopant in the first doped semiconductor segment 60. In one embodiment and when the first dopant semiconductor segment 60 contains an n-type dopant, the second dopant semiconductor segment 62 contains a p-type dopant, and vice versa. A p-n junction is present at the interface between the second doped semiconductor segment 62 and each of the first doped semiconductor segment 60 and the adjoined second semiconductor fins 38F. The first doped semiconductor segment 60 along with the second semiconductor fins 38F present on opposite sides of the first doped semiconductor segment 60 thus form an ESD diode with the second doped semiconductor segment 62. Each ESD diode has a U-shaped junction area. A portion of the bottom doped semiconductor layer 14 serves as an anode/cathode for the ESD.

In the present application, because adjacent semiconductor fins in the diode region 200 become part of an ESD diode, which provides additional junction area for the EDS diode, the EDS diode thus possesses increased junction area.

The second doped semiconductor segment 62 may be formed by a selective epitaxial growth process described above in formation of the first and second epitaxial semiconductor fin layers 36, 38. The second doped semiconductor segment 62 completely fills the diode trench 56. The top surface of the second doped semiconductor segment 62 can be formed coplanar with or above the bottom surface of the top spacer layer 26. The dopant can be provided during the epitaxial growth process by in-situ doping, or after epitaxial growth process by ion implantation or gas phase doping. The dopant concentration can be from $1\times10^{19}$ atoms/cm$^3$ to $1\times10^{22}$ atoms/cm$^3$.

Figure 16:
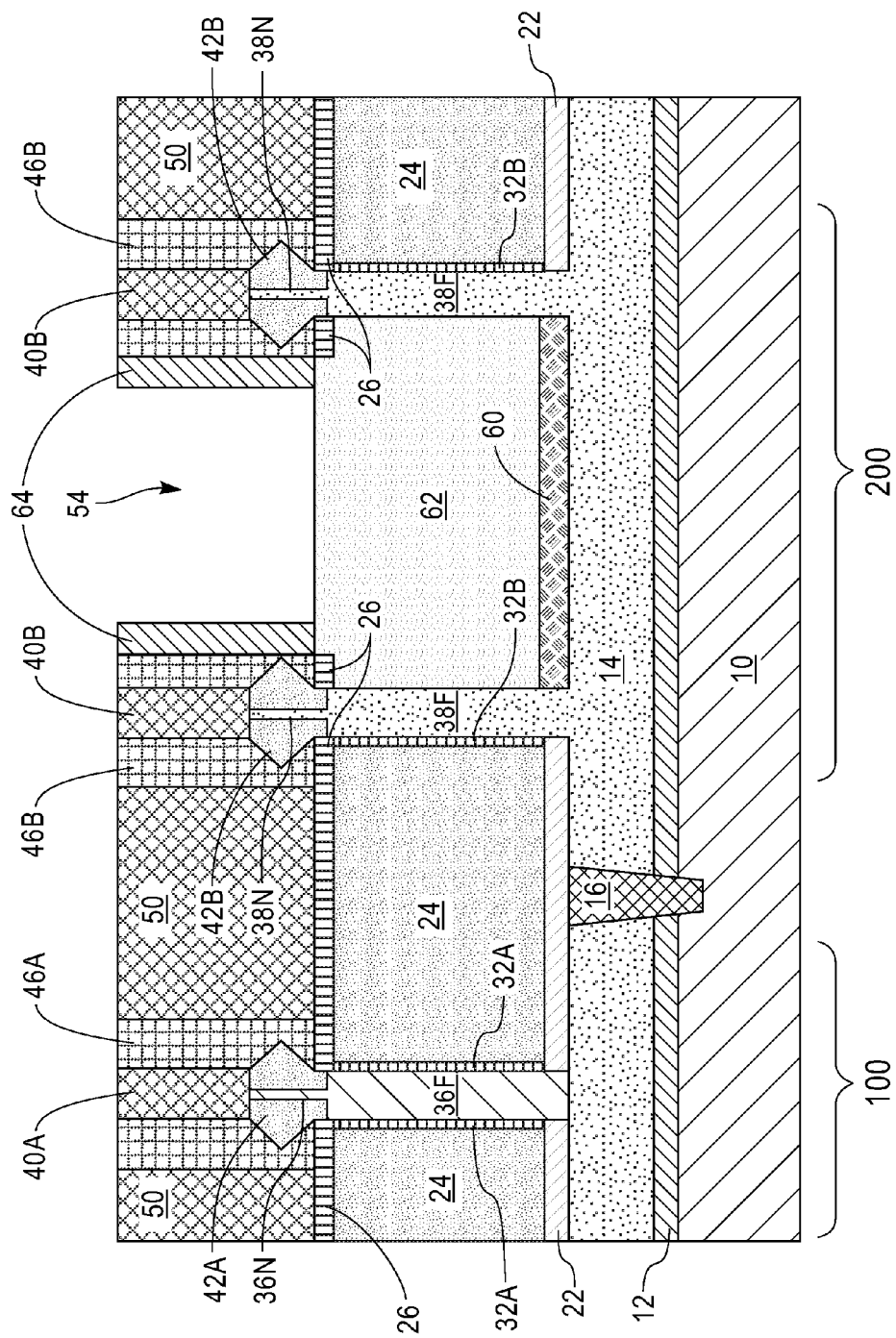
FIG. 16 is a cross-sectional view of the first exemplary semiconductor structure of FIG. 15 after forming a third sidewall spacer on physically exposed sidewalls of each opening.

Referring to FIG. 16, there is illustrated the first exemplary semiconductor structure of FIG. 15 after forming a third sidewall spacer 64 on physically exposed sidewalls of each opening 54. The third sidewall spacer 64 may include a dielectric nitride such as silicon nitride. The third sidewall spacer 64 may be formed by first depositing a dielectric material over the sidewalls and bottom of each opening 54 as well as on the top surfaces of the first and second dielectric caps 40A, 40B, the first and second sidewall spacers 46A, 46B and the ILD layer 50 by, for example, CVD or ALD. The horizontal portions of deposited dielectric material present on the top surfaces of the first and second dielectric caps 40A, 40B, the first and second sidewall spacers 46A, 46B and the ILD layer 50 and the bottom surface of each opening 53 are then removed, for example, by an anisotropic etch. The anisotropic etch can be a dry etch such as, for example, RIE or a wet etch. After etching, remaining vertical portions of the deposited dielectric material present on the sidewall surfaces of each opening 54 (i.e., outer sidewalls of the second sidewall spacers 46B) constitutes the third sidewall spacer(s) 64. The width of each third sidewall spacer 64 as measured from its base, can be from 5 nm to 25 nm, although lesser and greater widths can also be employed. As shown, a bottom surface of each third sidewall spacer 64 is in direct contact with the top surface of the second doped semiconductor segment 62.

Figure 17:
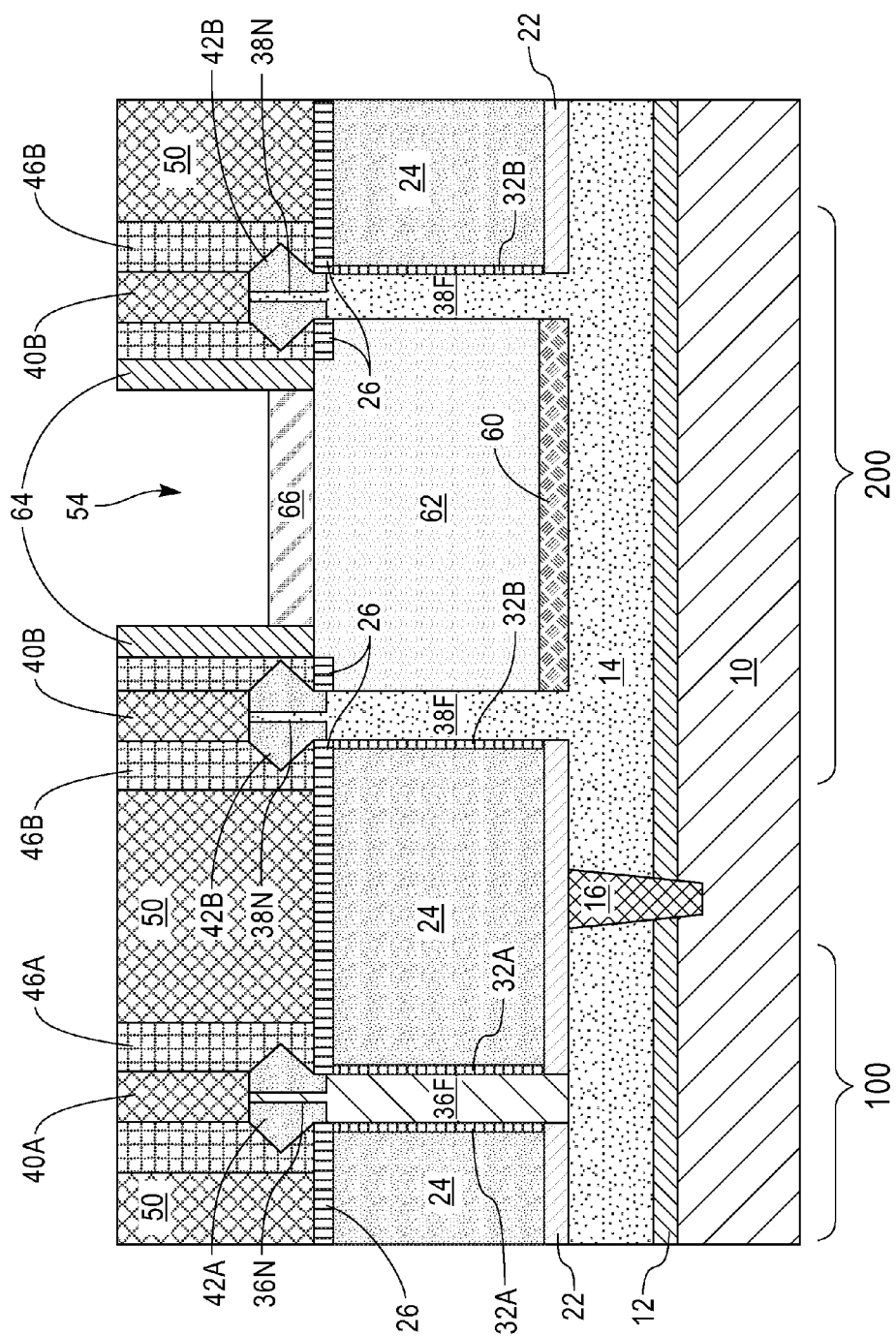
FIG. 17 is a cross-sectional view of the first exemplary semiconductor structure of FIG. 16 after forming a top contact segment on each second doped semiconductor segment.

Referring to FIG. 17, there is illustrated the first exemplary semiconductor structure of FIG. 16 after forming a top contact segment 66 on each second doped semiconductor segment 62. The top contact segment 66 may include a semiconductor material the same as, or different from, the semiconductor material that provides the second doped semiconductor segment 62. For example, the top contact segment 66 may be composed of Si or SiGe. The top contact segment 66 also contains a dopant having a conductivity type the same as that of the dopant in the second doped semiconductor segment 62. In one embodiment and when the second doped semiconductor segment 62 contains a p-type dopant, the top contact segment 66 also contains a p-type dopant. The top contact segment 66 serves as another anode/cathode for an ESD diode.

In one embedment, the top contact segment 66 may be formed by a selective epitaxial growth process described above in formation of the first and second epitaxial semiconductor fin layers 36, 38. The top contact segment 66 is formed partially filling the opening 54 such that a top surface of the top contact segment 66 is located between the top surface of the ILD layer 50 and the bottom surface of the ILD layer 50. The top contact segment 66 is heavily doped with a dopant concentration ranging from $1\times10^{21}$ atoms/cm$^3$ to $1\times10^{22}$ atoms/cm$^3$. The dopant can be provided during the epitaxial growth process by in-situ doping, or after epitaxial growth process by ion implantation or gas phase doping. Alternatively, the top contact segment 66 may be formed by implanting the dopant into the topmost portion of the second doped semiconductor segment 62 in instances where the second doped semiconductor segment 62 overfills the diode trench 56.

Figure 18:
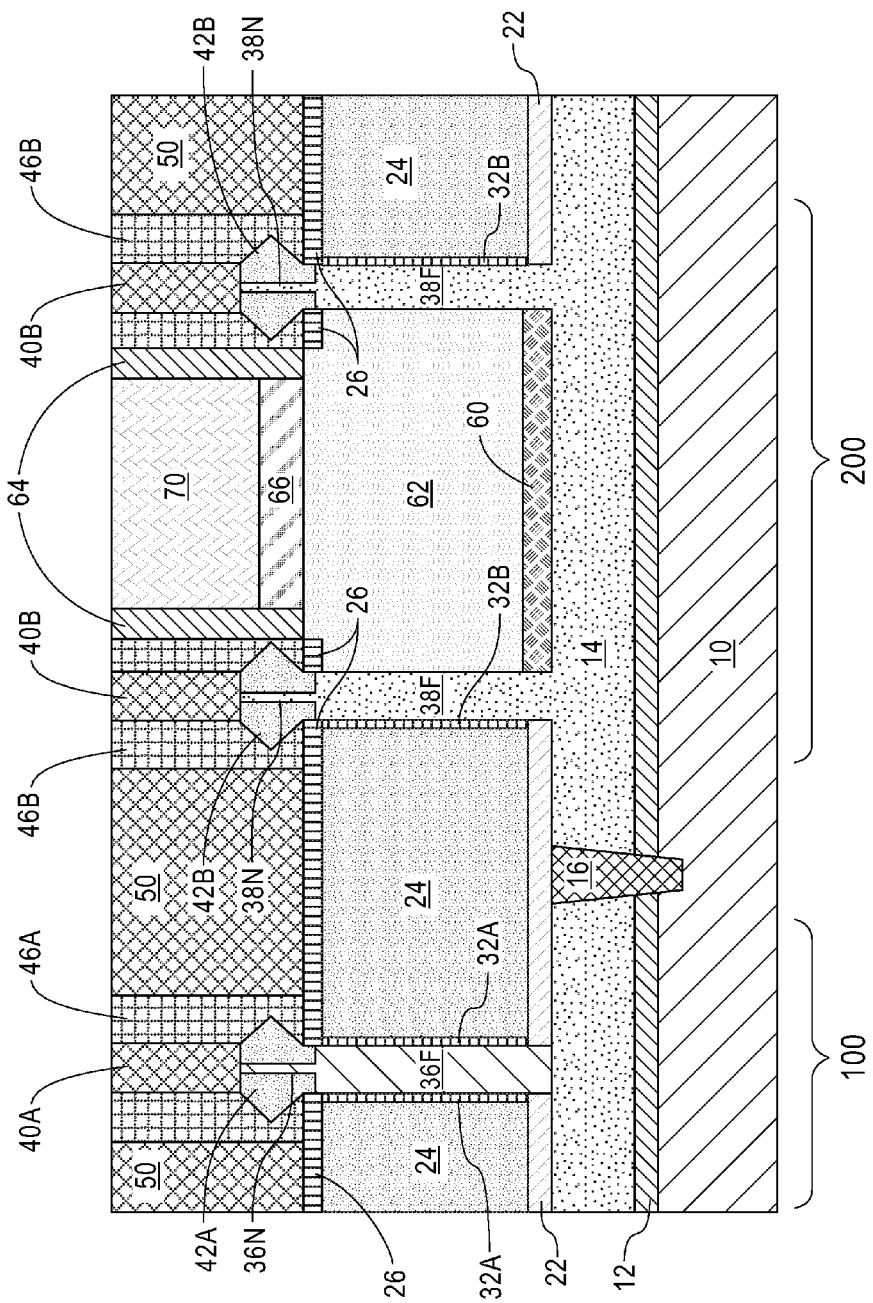
FIG. 18 is a cross-sectional view of the first exemplary semiconductor structure of FIG. 17 after forming a ILD fill portion to completely fill the opening.

Referring to FIG. 18, there is illustrated the first exemplary semiconductor structure of FIG. 17 after forming a ILD fill portion 70 to completely fill the opening 54. The ILD fill portion 70 may include a dielectric oxide such as, for example, silicon dioxide or a flowable oxide. The ILD fill portion 70 may be formed by a deposition process such as, for example, CVD, PVD or spin coating. Subsequently, a planarization process can be performed to planarize the ILD fill portion 70, which stops on the top surface of the ILD layer 50. The planarization process may include, for example, CMP. After planarization, the top surface of the ILD fill portion 70 is coplanar with the top surface of the ILD layer 50.

Figure 19:
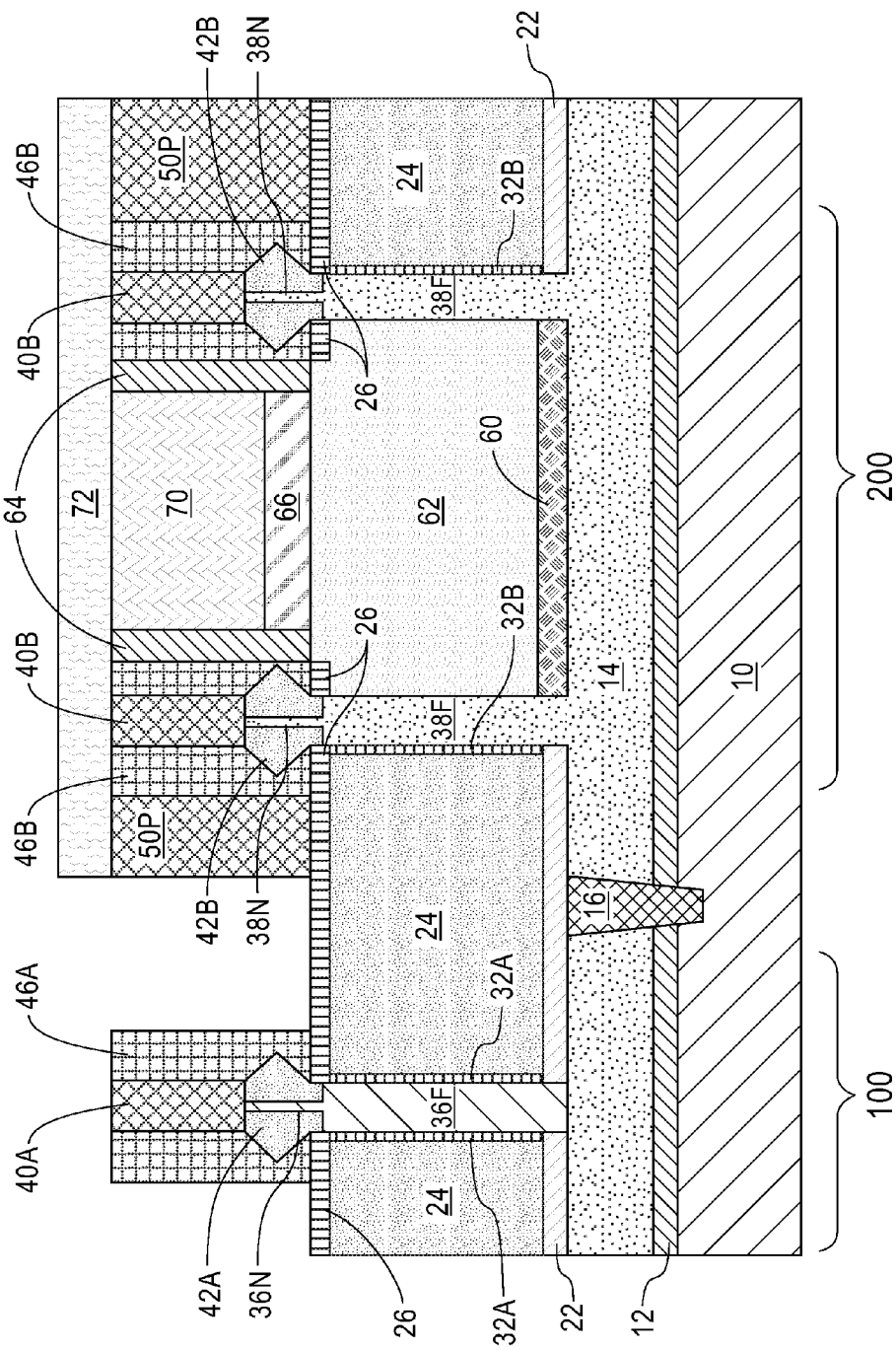
FIG. 19 is a cross-sectional view of the first exemplary semiconductor structure of FIG. 18 after forming a second patterned mask layer covering the diode region, while exposing the transistor region and then removing the ILD layer from the transistor region.

Referring to FIG. 19, there is illustrated the first exemplary semiconductor structure of FIG. 18 after forming a second patterned mask layer 72 covering the diode region 200, while exposing the transistor region 100 and then removing the ILD layer 50 from the transistor region 100.

The second patterned mask layer 72 can be formed by applying a second mask layer (not shown) over the entire top surface of the structure of FIG. 18, and lithographically patterning the second mask layer to remove a portion of the second mask layer from the transistor region 100.

Next, a portion of the ILD layer 50 in the transistor region 100 not covered by the second patterned mask layer 72 is removed. For example, an anisotropic etch may be performed to etch the portion of the ILD layer 50 not underlying the second patterned mask layer 72 selective to the top spacer layer 26, each first sidewall spacer 46A and each first dielectric cap 40A. In one embodiment, a RIE is performed. A remaining portion of the ILD layer 50 in the diode region 200 is herein referred to as an ILD portion 50P.

Figure 20:
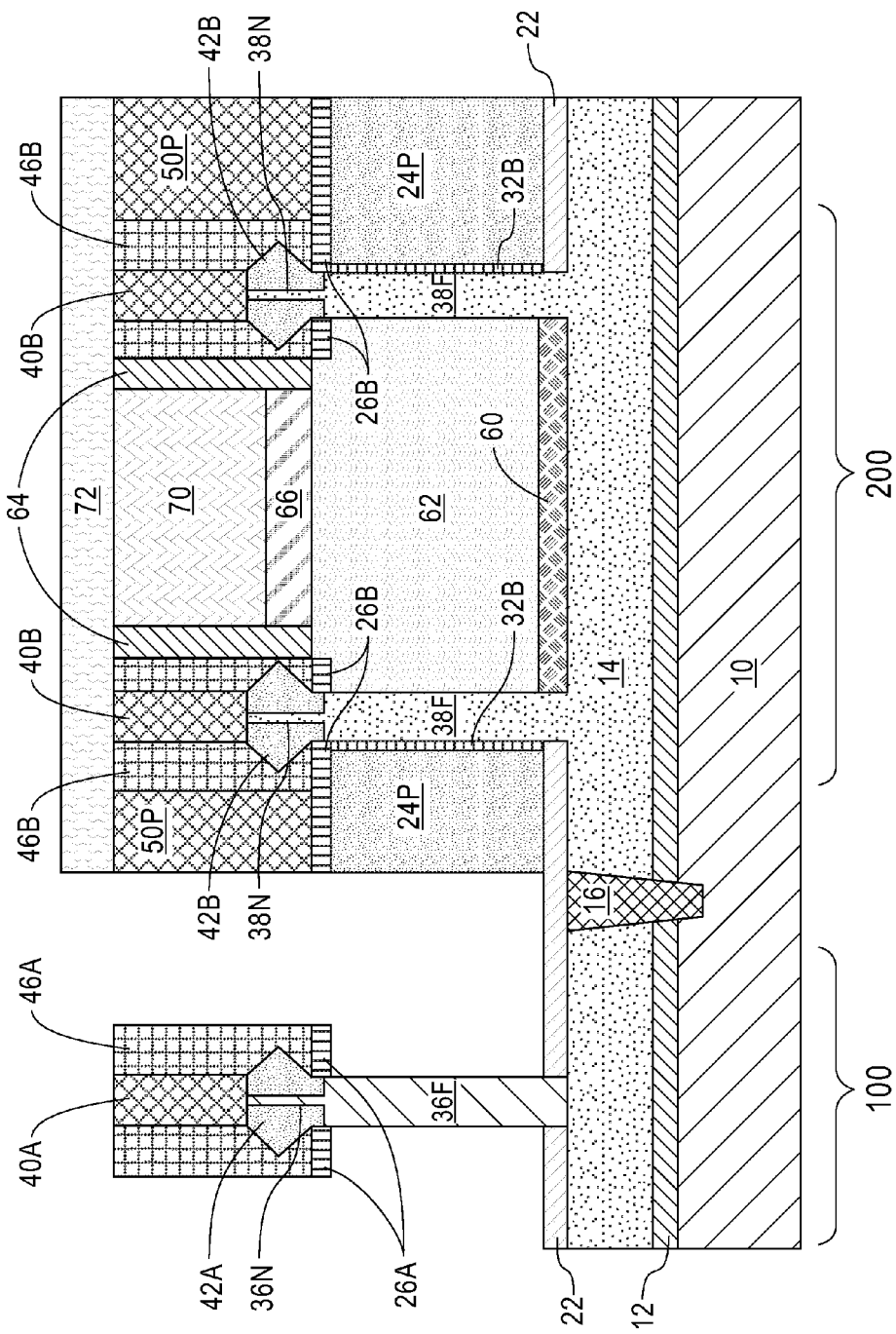
FIG. 20 is a cross-sectional view of the first exemplary semiconductor structure of FIG. 19 after sequentially removing a portion of the top spacer layer not covered by the first sidewall spacer, a portion of the sacrificial gate layer and the first protective layer from the transistor region.

Referring to FIG. 20, there is illustrated the first exemplary semiconductor structure of FIG. 19 after sequentially removing a portion of the top spacer layer 26 not covered by the first sidewall spacer 46A, a portion of the sacrificial gate layer 24 and the first protective layer 32A from the transistor region 100. For example, a first anisotropic etch process such as RIE may be performed to etch the physically exposed portion of the top spacer layer 26 not underlying the first sidewall spacer 46A and the second patterned mask layer 72 selective to the sacrificial gate layer 24. Then a second anisotropic etch process may be permed to etch a portion of the sacrificial gate layer 24 not underlying the first sidewall spacer 46A and the second patterned mask layer 72 selective to the bottom spacer layer 22. Next, portions of the sacrificial gate layer 24 and the first protective layer 32A underlying the first sidewall spacer 46A can be removed by selective etching or another technique. The removal of the first protective layer 32A re-exposes a channel region of each first semiconductor fin 36F. After etching, the second patterned mask layer 72 can be removed, for example, by oxygen-based plasma etching. A remaining portion of the top spacer layer 26 underneath each first sidewall spacer 46A constitutes a first top spacer 26A, a remaining portion of the top spacer layer 26 located in the diode region 200 constitutes a second top spacer 26A, and a remaining portion of the sacrificial gate layer 24 located in the diode region 200 constitutes a sacrificial gate portion 24P.

Figure 21:
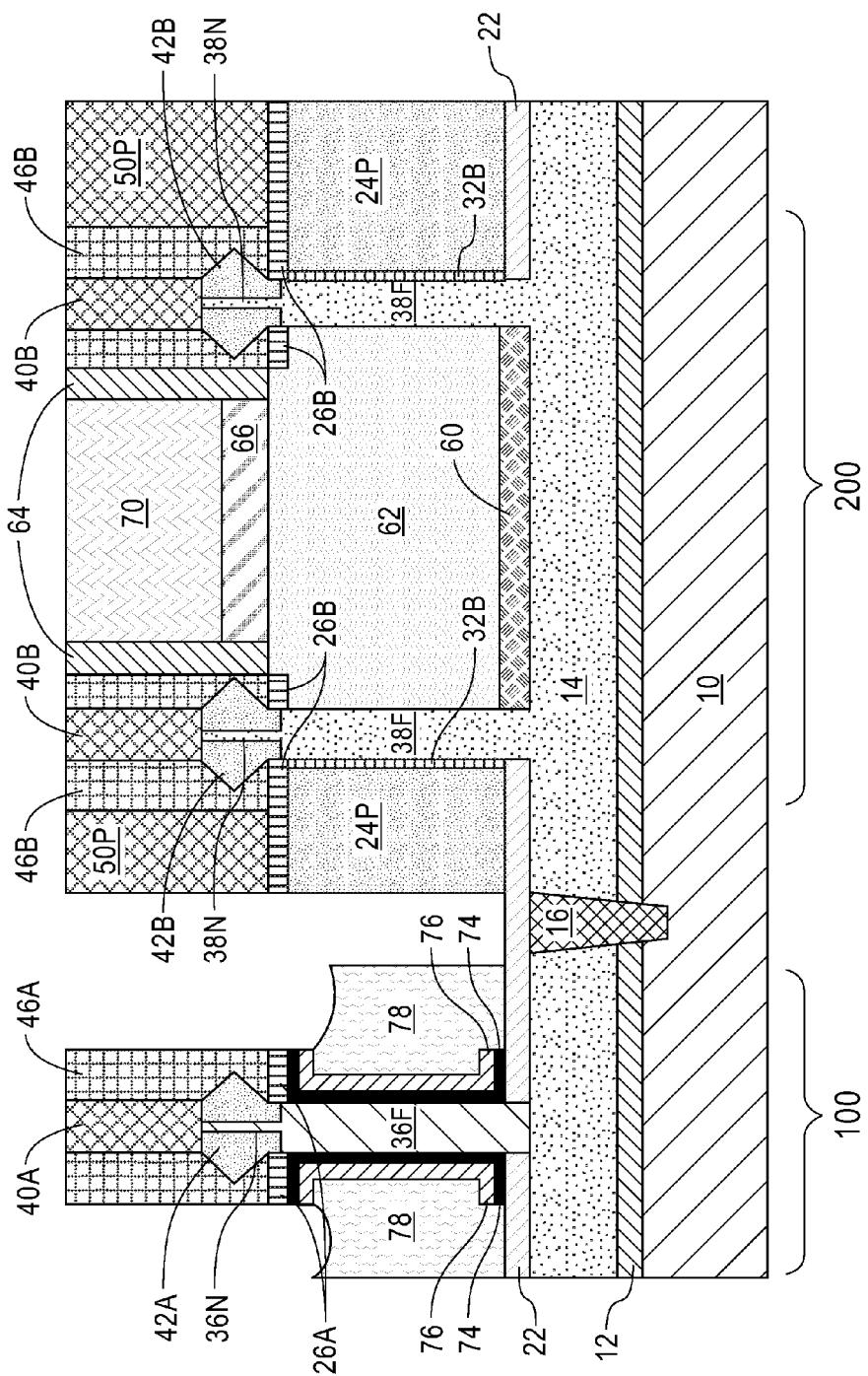
FIG. 21 is a cross-sectional view of the first exemplary semiconductor structure of FIG. 20 after forming a metal gate structure laterally surrounding the channel region of each first semiconductor fin.

Referring to FIG. 21, there is illustrated the first exemplary semiconductor structure of FIG. 20 after forming a metal gate structure laterally surrounding the channel region of each first semiconductor fin 36F. The metal gate structure includes, from bottom to top, a gate dielectric 74, a work function metal 76 and a metal gate electrode 78.

The gate dielectric 74 may include a high-k dielectric material having a dielectric constant greater than silicon dioxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, Six, a silicate thereof, and an alloy thereof. Each value of x is independently from 0.5 to 3 and each value of y is independently from 0 to 2. In some embodiments, a multiple gate dielectric layers comprising different gate dielectric materials, e.g. silicon oxide, and a high-k gate dielectric material can be formed.

The work function metal 76 may include a metal nitride, a metal carbide or a combination thereof. Exemplary metal nitrides that can be employed include, but are not limited to, TiN, HfN, HfSiN, TaN, TaSiN, WN, MoN and NbN. Exemplary metal carbides that can be employed include, but are not limited to, TiC, TaC and HfC.

The metal gate electrode 78 may include a conductive metal including, but not limited to, W, Cu, Al, Co or an alloy thereof.

The metal gate structure (74, 76, 78) can be formed by first forming a gate dielectric layer (not shown) on exposed surfaces of the bottom spacer layer 22, the first semiconductor fin 36F, the first and second top spacers 26A, 26B, the first and second sidewall spacers 46A, 46B, the first and second dielectric caps 40A, 40B, the third sidewall spacer 64, the ILD portion 50P and the ILD fill portion 70, and forming a work function metal layer (not shown) on the gate dielectric layer. The gate dielectric layer and the work functional metal may be formed by a conformal deposition technique including, for example, CVD, PECVD, PVD and ALD. The thickness of the gate dielectric layer can be from 1 nm to 10 nm, although lesser and greater thicknesses can also be employed. The thickness of the work function metal layer can be from 1 nm to 10 nm, although lesser and greater thicknesses can also be employed.

Subsequently, portions of the work function metal layer and the gate dielectric layer not underlying the first top spacer 26A are removed by at least one etch. For example, a first etching process is performed to etch the work functional metal layer selective to the gate dielectric layer, and a second etching process is then performed to etch the gate dielectric layer selective to the bottom spacer layer 22, the first and second top spacers 26A, 26B, the first and second sidewall spacers 46A, 46B, the first and second dielectric caps 40A, 40B, the third sidewall spacer 64, the ILD portion 50P and the ILD fill portion 70. In one embodiment, the first etching process and the second etching process can etch be a dry etch such as, for example, RIE. A remaining portion of the gate dielectric layer constitutes the gate dielectric 74, and a remaining portion of the work function metal layer constitutes the work function metal 76.

Next, a metal gate electrode layer (not shown) is deposited on the physically exposed portion of bottom spacer layer 22 and the work function metal 76 such that a top surface of the metal gate layer is located above the top surface of the ILD portion 50P. The metal gate electrode layer may be formed utilizing a deposition process including, for example, CVD, PECVD, PVD, and other like deposition processes. A planarization process, for example, CMP, may be performed to polish the surface of the metal gate electrode layer. The metal gate electrode layer is subsequently recessed until the top surface the metal gate electrode layer is coplanar with, or below the topmost surface of the work function metal 76. In one embodiment, an anisotropic etch such as RIE may be performed to recess the metal gate electrode layer. End portions of the metal gate electrode layer contacting the sacrificial gate portion 24P are then removed by an anisotropic etch (e.g., RIE), providing a gap between the metal gate structure (74, 76, 78) and the sacrificial gate portion 24P. A remaining portion of the metal gate electrode layer constitutes the metal gate electrode 78.

Thus, one or more vertical FET is formed in the transistor region 100. Each vertical FET includes a doped bottom semiconductor layer 14, a first semiconductor fin 36F extending upwards from a first portion the doped bottom semiconductor layer located in the transistor region 100, a first doped top semiconductor region 42A laterally contacting a top portion of the first semiconductor fin 36F, and a metal gate structure (74, 76, 78) laterally contacting a channel region of the first semiconductor fin 36F. The doped bottom semiconductor layer 14 serves as a source/drain region for the vertical FET and is separated from the metal gate structure (74, 76, 78) by a bottom spacer layer 22. The first doped top semiconductor region 42A serves as another source/drain region for the vertical FET and is separated from the metal gate structure (74, 76, 78) by a first top pacer 26A.

Figure 22:
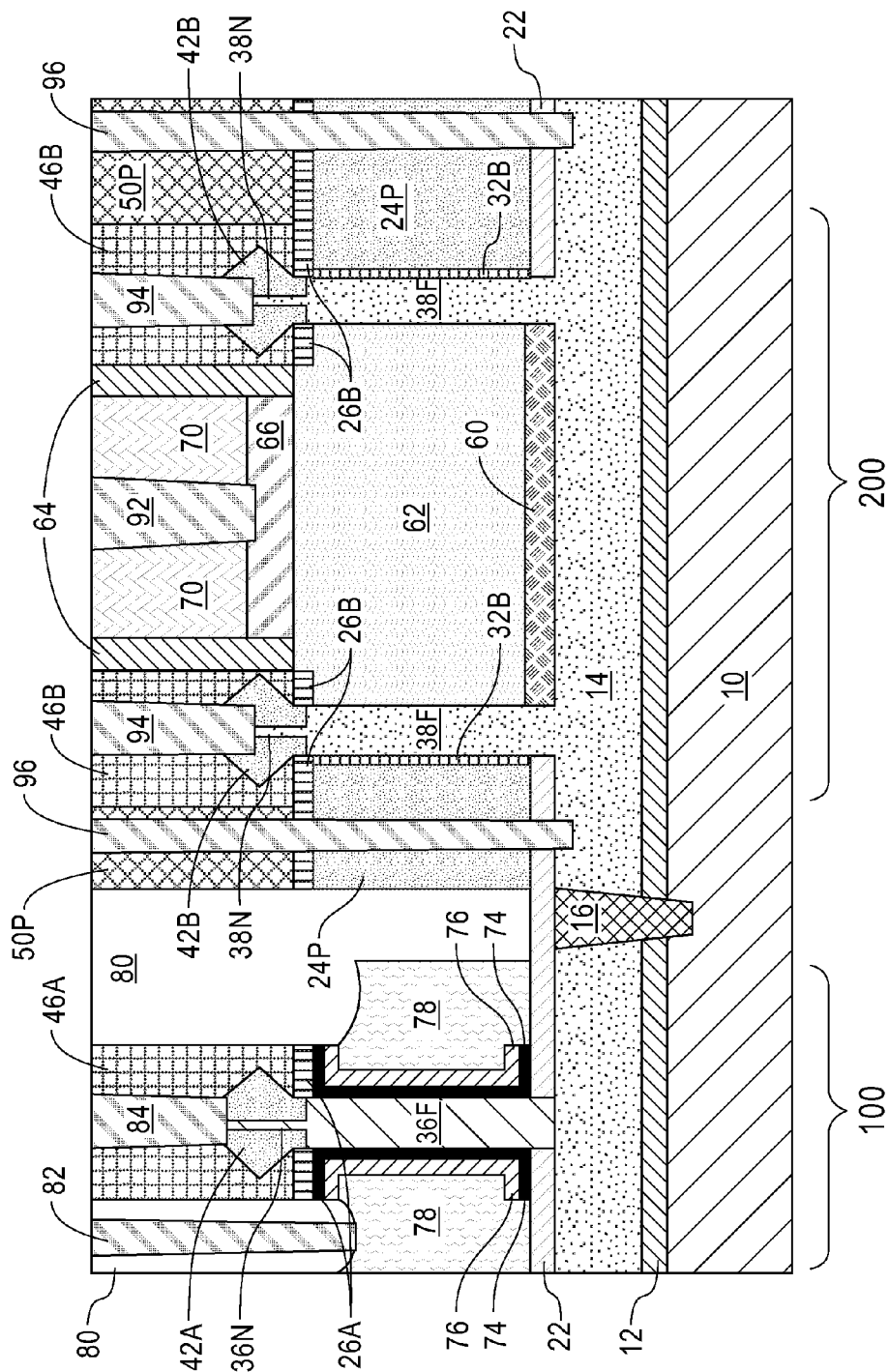
FIG. 22 is a cross-sectional view of the first exemplary semiconductor structure of FIG. 21 after forming a dielectric material portion covering the first metal gate structure in the transistor region and forming contact structures.

Referring to FIG. 22, there is illustrated the first exemplary semiconductor structure of FIG. 21 after forming a dielectric material portion 80 covering each vertical FET in the transistor region 100 and forming contact structures providing electrical connection for various components of each vertical FET and each ESD diode.

The dielectric material portion 80 is formed on the bottom spacer layer 22 and the metal gate structure (74, 76, 78). The dielectric material portion 80 fills the gap between the metal gate structure (74, 76, 78) and the sacrificial gate portion 24P, thus electrically insulates the transistor region 100 and the diode region 200. The dielectric material portion 80 may include a low-k dielectric material the same as, or different from, the low-k dielectric material that provides the ILD portion 50P. The dielectric material portion 80 may be deposited, for example, by CVD, PVD or spin coating. The dielectric material portion 80 can be initially formed such that an entirety of the top surface of the dielectric material portion 80 is formed above the top surface of the ILD portion 50P. The dielectric material portion 80 can be subsequently planarized, for example, by CMP and/or a recess etch. After planarization, the top surface of the dielectric material portion 80 is coplanar with the top surface of the ILD portion 50P.

The various contact structures for each vertical FET includes a gate contact structure 82 extending through the dielectric material portion 80 to form contact with the metal gate electrode 78, a first source/drain contact structure 86 extending through the first dielectric cap 40A to form contact with the first doped top semiconductor region 42A and a second source/drain contact structure (not shown) contacting the first portion of the doped bottom semiconductor portion layer located in the transistor region 100. The various contact structures for each ESD diode includes a first anode/cathode contact structure 92 extending through the ILD fill portion 70 to form contact with the top contact segment 66, a second anode/cathode contact structure 94 extending through a second dielectric cap 40B to form contact with each second doped top semiconductor region 42B, and a third anode/cathode contact structure 96 extending through the ILD portion 50P, the second top spacer 26B, a portion of the sacrificial layer portion 24P that contacts an outer sidewall of each second semiconductor fin 38F and the bottom spacer layer 22 to form contact with the second portion of doped bottom semiconductor layer 14 located in the diode region 200. The third anode/cathode contact structures 96 are optional, and can be omitted in some embodiments of the present application.

The contact structures (82, 84, 92, 94, 96) can be formed by formation of contact openings (not shown) utilizing a combination of lithographic patterning and anisotropic etch followed by deposition of a conductive material such as, for example, Cu or W and planarization that removes excess conductive material from above the top surfaces of the ILD portion 50P, the ILD fill portion 70 and the dielectric material portion 80.

Optionally, contact liners (not shown) may be formed on the sidewalls and bottoms surfaces of each contact opening before filling each contact opening with the conductive material. The contact liners may include TiN.

Figure 23:
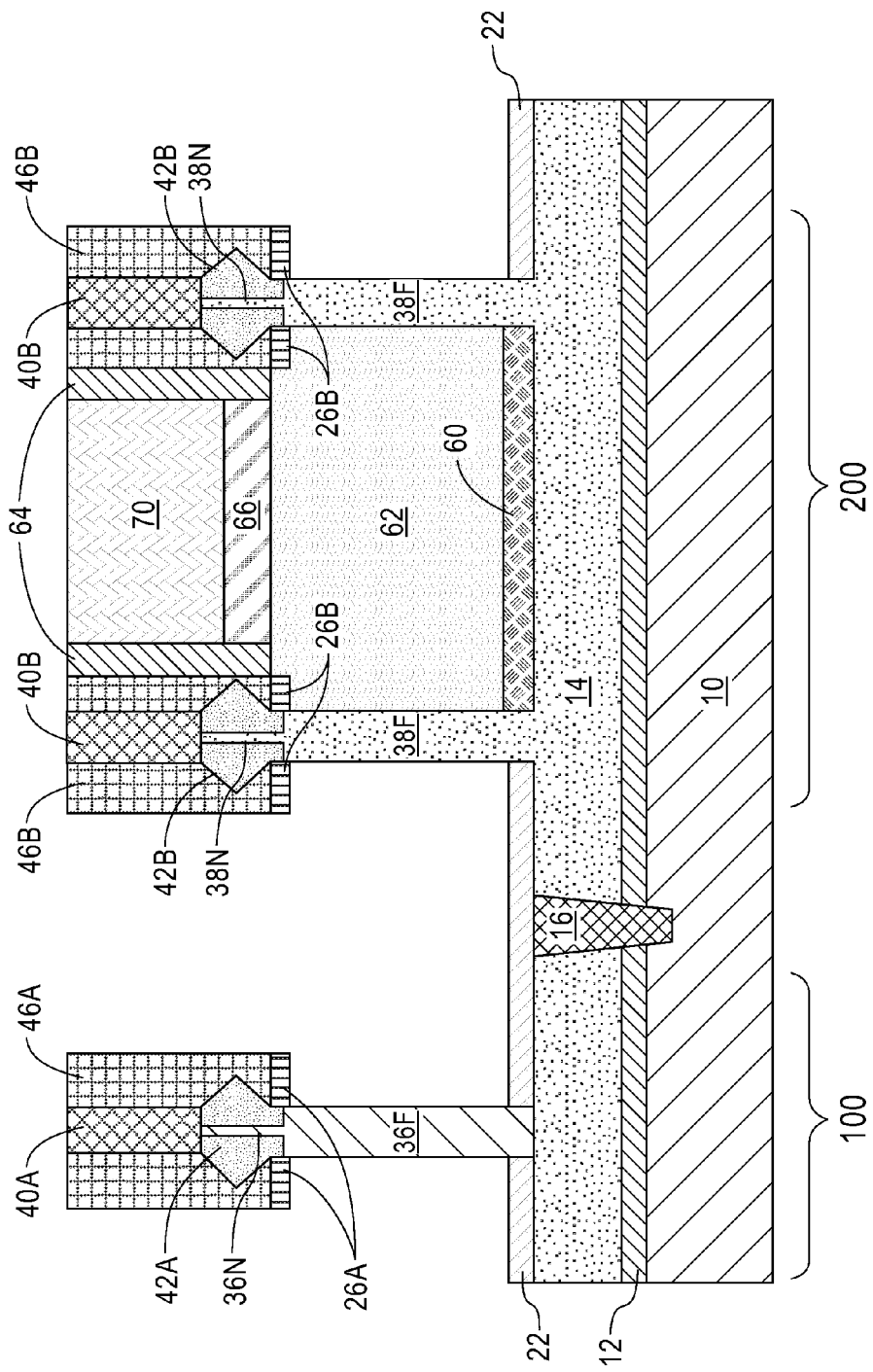
FIG. 23 is a cross-sectional view of a second exemplary semiconductor structure according to a second embodiment of the present application that can be derived from the first exemplary semiconductor structure of FIG. 18 after removing the ILD layer, portions of the top spacer layer not underlying the first and second sidewall spacers, the sacrificial gate layer and the first and second protective layers from both transistor region and diode region.

Referring to FIG. 23, there is illustrated a second exemplary semiconductor structure according to a second embodiment of the present application that can be derived from the first exemplary semiconductor structure of FIG. 18 after removing the ILD layer 50, portions of the top spacer layer 26 not underlying the first and second sidewall spacers 46A, 48B, the sacrificial gate layer 24 and the first and second protective layers 32A, 32B from the entire structure (e.g., both transistor region 100 and diode region 200) by performing processing steps described above in FIGS. 19-20. After removal, sidewalls of a channel region of each first semiconductor fin 36F are exposed, and an outer sidewall of a channel region of each second semiconductor fin 38F is exposed.

Figure 24:
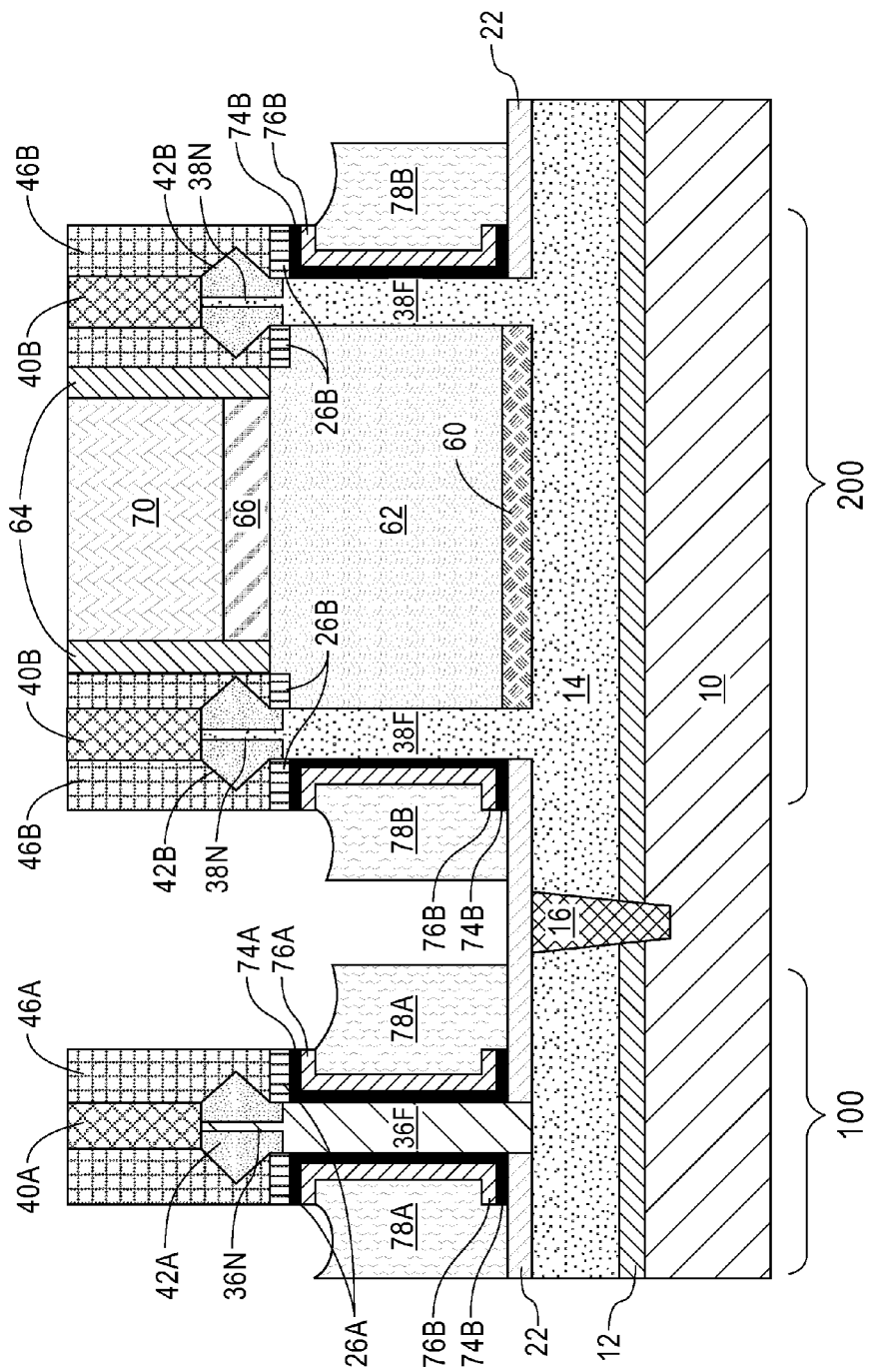
FIG. 24 is a cross-sectional view of the second exemplary semiconductor structure of FIG. 23 after forming a first metal gate structure laterally surrounding the channel region of each first semiconductor fin and a second metal gate structure laterally contacting the outer sidewall of the channel region of each second semiconductor fin.

Referring to FIG. 24, there is illustrated the second exemplary semiconductor structure of FIG. 23 after forming a first metal gate structure laterally surrounding the channel region of each first semiconductor fin 36F and a second metal gate structure laterally contacting the outer sidewall of the channel region of each second semiconductor fin 38F. The first metal gate structure includes a first gate dielectric 74A, a first work function metal 76A and a first metal gate electrode 78A. Each second metal gate structure includes a second gate dielectric 74B, a second work function metal 76B and a second metal gate electrode 78B. The first and the second metal gate structures (74A, 76A, 78A; 74B, 76B, 78B) can be formed by performing processing steps described in FIG. 21.

Figure 25:
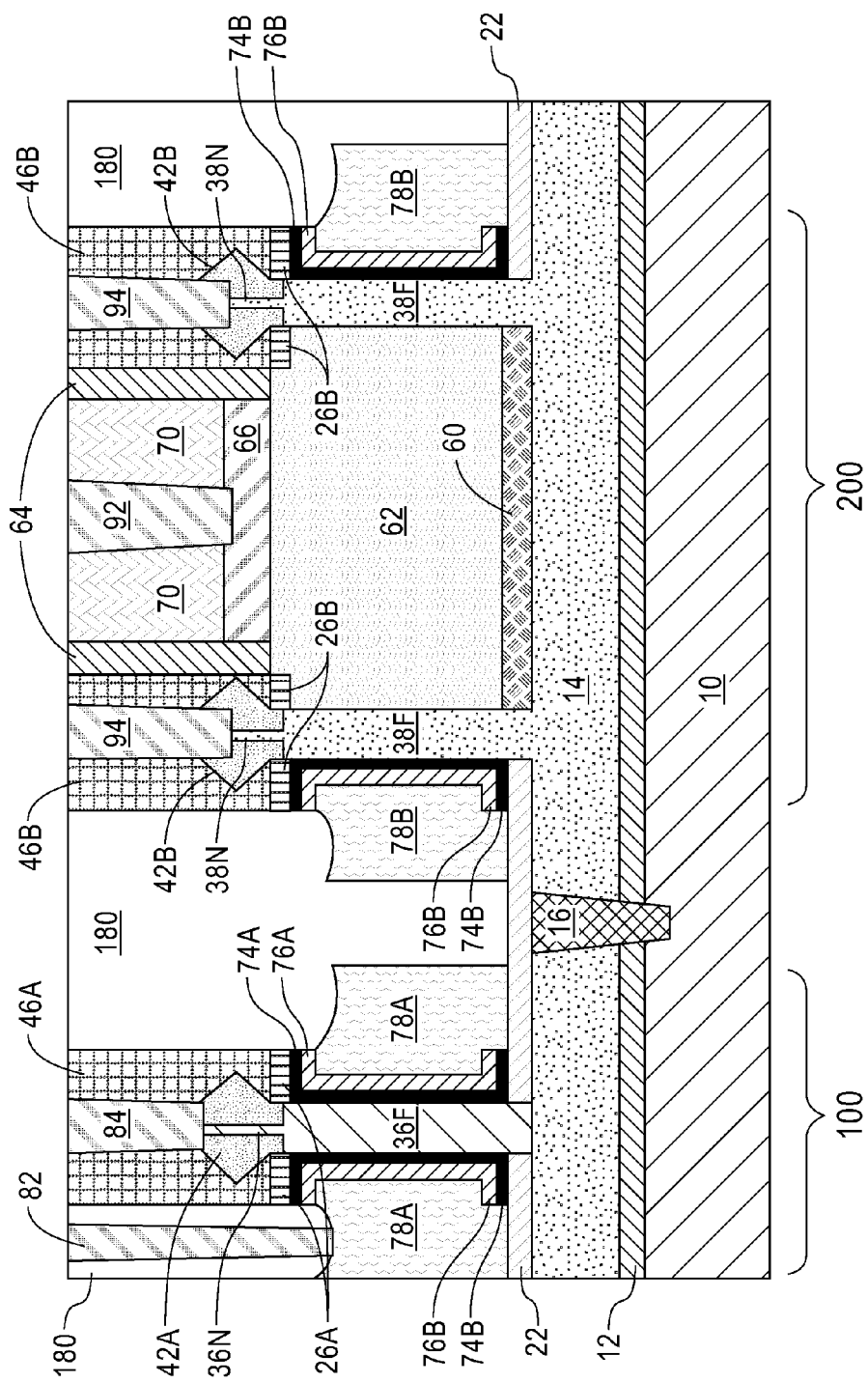
FIG. 25 is a cross-sectional view of the second exemplary semiconductor structure of FIG. 24 after forming a dielectric material layer over the bottom spacer layer, covering the first and metal second gate structures and forming various contact structures.

Referring to FIG. 25, there is illustrated the second exemplary semiconductor structure of FIG. 24 after forming a dielectric material layer 180 over the bottom spacer layer 22, covering the first and metal second gate structures (74A, 76A, 78A; 74B, 76B, 78B) and forming various contact structures.

The various contact structures for each vertical FET includes a gate contact structure 82 extending through the dielectric material layer 180 to form contact with the first metal gate electrode 78A, a first source/drain contact structure 86 extending through the first dielectric cap 40A to form contact with the first doped top semiconductor region 42A and a second source/drain contact structure (not shown) contacting the first doped bottom semiconductor portion 14A. The various contact structures for each ESD diode includes a first anode/cathode contact structure 92 extending through the ILD fill portion 70 to form contact with the top contact segment 66 and a second anode/cathode contact structure 94 extending through a second dielectric cap 40B to form contact with each second doped top semiconductor region 42B.

The dielectric material layer 180 and the contact structures (82, 84, 92, 94) can be formed by performing processing steps described above in FIG. 22.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising an electrostatic discharge (ESD) diode located in a region of a semiconductor substrate, wherein the ESD diode comprises:
a pair of semiconductor fins extends upwards from a portion of a doped bottom semiconductor layer located over the semiconductor substrate;
a first doped semiconductor segment adjoined the pair of the semiconductor fins;
a second doped semiconductor segment located over the first doped semiconductor segment and laterally contacting an inner sidewall of a channel region of each semiconductor fin in the pair of semiconductor fins; and a top contact segment located over the second doped semiconductor segment.

2. The semiconductor structure of claim 1, wherein a p-n junction is present at an interface between the second doped semiconductor segment and each semiconductor fin in the pair of semiconductor fins.

3. The semiconductor structure of claim 1, further comprising an interlevel dielectric (ILD) fill portion located over the top contact segment.

4. The semiconductor structure of claim 1, further comprising a sidewall spacer laterally surrounding the top contact segment and the ILD fill portion.

5. The semiconductor structure of claim 1, further comprising a doped top semiconductor region laterally surrounding a top portion of each semiconductor fin in the pair of semiconductor fins that is located above the channel region of each semiconductor fin.

6. The semiconductor structure of claim 5, further comprising a protective layer present on an outer sidewall of the channel region of each semiconductor fin in the pair of semiconductor fins.

7. The semiconductor structure of claim 6, further comprising a sacrificial gate portion laterally contacting each protective layer.

8. The semiconductor structure of claim 7, further comprising a bottom spacer layer located between the doped bottom semiconductor layer and the sacrificial gate portion.

9. The semiconductor structure of claim 7, further comprising a top spacer located between each doped top semiconductor region and the sacrificial gate portion.

10. The semiconductor structure of claim 5, further comprising a metal gate structure laterally contacting an outer sidewall of the channel region of each semiconductor fin of the pair of semiconductor fins.

11. The semiconductor structure of claim 10, further comprising a vertical field effect transistor (FET) located in another region of the semiconductor substrate, wherein the vertical effect transistor comprises:
    another semiconductor fin extends upwards from another portion of the doped bottom semiconductor layer;
    another metal gate structure laterally surrounding a channel region of the another semiconductor fin; and
    another doped top semiconductor region laterally surrounding a top portion of the another semiconductor fin that is located above the channel region of the another semiconductor fin.

12. A method of forming a semiconductor structure comprising:
    forming a first semiconductor fin extending upwards from a first portion of a doped bottom semiconductor layer and a pair of second semiconductor fins extending from a second portion of the doped bottom semiconductor layer, wherein the first semiconductor fin and the pair of second semiconductor fins are laterally surrounded by a material stack including, from bottom to top, a bottom spacer layer, a sacrificial gate layer, a top spacer layer and a dielectric capping layer, and the pair of second semiconductor fins has a first conductivity type;
    removing the dielectric capping layer to exposing a top portion of each of the first semiconductor fin and the pair of the second semiconductor fins located above the top spacer layer;
    forming a first doped top semiconductor region laterally surrounding the top portion of the first semiconductor fin and a second doped top semiconductor region laterally surrounding the top portion of each second semiconductor fin;
    forming a first sidewall spacer on sidewalls of the first doped top semiconductor region and a second sidewall spacer on sidewalls of each second top semiconductor region;
    forming an interlevel dielectric (ILD) layer laterally surrounding the first sidewall spacer and each second sidewall spacer;
    removing a portion of the ILD layer located between the adjacent second sidewall spacers to provide an opening exposing a portion of the top spacer layer;
    removing the exposed portion of the top spacer layer and a portion of the sacrificial gate layer and a portion of the bottom spacer layer located between the pair of second semiconductor fins to provide a diode trench underneath the opening;
    forming a first doped semiconductor segment of the first conductivity type on a surface of the doped bottom semiconductor layer that is exposed by the diode trench; and
    forming a second doped semiconductor segment of a second conductivity type opposite to the first conductivity type on the first doped semiconductor segment, wherein the second doped semiconductor segment laterally contacts an inner sidewall of a channel portion of each second semiconductor fin previously covered by the removed portion of the sacrificial gate layer.

13. The method of claim 12, further comprising forming a top contact segment of the second conductivity type on the second doped semiconductor segment to completely fill the diode trench.

14. The method of claim 13, further comprising forming an ILD fill portion on the top contact segment, wherein the ILD fill portion completely fills the opening.

15. The method of claim 14, further comprising removing a portion of the sacrificial gate layer laterally surrounding the first semiconductor fin to expose a channel region of the first semiconductor fin, wherein a portion of the sacrificial gate layer that laterally contacts an outer sidewall of each second semiconductor fin remains.

16. The method of claim 15, further comprising forming a first metal gate structure laterally surrounding the channel region of the first semiconductor fin.

17. The method of claim 16, further comprising forming a first transistor contact structure contacting the first metal gate structure, a second transistor contract structure contacting the first doped top semiconductor region, a first diode contact structure contacting the top contact segment, a second diode contact structure contacting each second doped top semiconductor region and a third diode contact structure contacting a portion of the bottom doped semiconductor layer located beneath the portion of the sacrificial gate layer that laterally contacts the outer sidewall of each second semiconductor fin.

18. The method of claim 13, further comprising removing an entirety of the sacrificial gate layer to expose a channel region of the first semiconductor fin and a channel region of each second semiconductor fin.

19. The method of claim 18, further comprising forming a first metal gate structure laterally surrounding the channel region of the first semiconductor fin, and a second metal gate structure laterally contacting an outer sidewall of the channel region of each second semiconductor fin.

20. The method of claim 19, further comprising forming a first transistor contact structure contacting the first metal gate structure, a second transistor contract structure contacting the first doped top semiconductor region, a first diode contact structure contacting the top contact segment and a second diode contact structure contacting each second doped top semiconductor region.

* * * * *